(12) United States Patent
Das et al.

(10) Patent No.: US 11,334,788 B2
(45) Date of Patent: May 17, 2022

(54) NEURAL NETWORK INCLUDING MEMORY ELEMENTS IMPLEMENTED AT NODES

(71) Applicant: Arm Limited, Cambridge (GB)

(72) Inventors: Shidhartha Das, Upper Cambourne (GB); Rune Holm, Cambridge (GB)

(73) Assignee: Arm Limited, Cambridge (GB)

( * ) Notice: Subject to any disclaimer, the term of this patent is extended or adjusted under 35 U.S.C. 154(b) by 665 days.

(21) Appl. No.: 16/315,991

(22) PCT Filed: Jun. 14, 2017

(86) PCT No.: PCT/GB2017/051734
§ 371 (c)(1),
(2) Date: Jan. 7, 2019

(87) PCT Pub. No.: WO2018/007783
PCT Pub. Date: Jan. 11, 2018

(65) Prior Publication Data
US 2019/0236445 A1    Aug. 1, 2019

(30) Foreign Application Priority Data

Jul. 7, 2016 (GB) ..................... 1611857

(51) Int. Cl.
*G06N 3/06* (2006.01)
*G06N 3/04* (2006.01)
(Continued)

(52) U.S. Cl.
CPC ............ *G06N 3/0635* (2013.01); *G06N 3/04* (2013.01); *G06N 3/063* (2013.01); *G06N 3/08* (2013.01);
(Continued)

(58) Field of Classification Search
CPC ........ G06N 3/04; G06N 3/0635; G11C 11/54; G11C 13/0002
See application file for complete search history.

(56) References Cited

U.S. PATENT DOCUMENTS

2013/0117209 A1   5/2013 Aparin
2013/0119340 A1   5/2013 Hou et al.
(Continued)

FOREIGN PATENT DOCUMENTS

EP        1097456 A1    5/2001
WO     2010114832 A1   10/2010
(Continued)

OTHER PUBLICATIONS

Hasan, Raqibul, Chris Yakopcic, and Tarek M. Taha. "Ex-situ training of dense memristor crossbar for neuromorphic applications." Proceedings of the 2015 IEEE/ACM International Symposium on Nanoscale Architectures (NANOARCH' 15). IEEE, 2015. (Year: 2015).*

(Continued)

*Primary Examiner* — Hal Schnee
(74) *Attorney, Agent, or Firm* — Berkeley Law & Technology Group, LLP

(57) ABSTRACT

Broadly speaking, embodiments of the present techniques provide a reconfigurable hardware-based artificial neural network, wherein weights for each neural network node of the artificial neural network are obtained via training performed external to the neural network.

17 Claims, 11 Drawing Sheets

(51) Int. Cl.
- G11C 11/54 (2006.01)
- G06N 3/063 (2006.01)
- G11C 13/00 (2006.01)
- G06N 3/08 (2006.01)

(52) U.S. Cl.
CPC .......... *G11C 11/54* (2013.01); *G11C 13/0002* (2013.01)

(56) References Cited

U.S. PATENT DOCUMENTS

| | | | |
|---|---|---|---|
| 2015/0324691 A1 | 11/2015 | Dropps et al. | |
| 2017/0109628 A1* | 4/2017 | Gokmen | G06N 3/0472 |
| 2017/0243109 A1* | 8/2017 | Hu | G06N 3/0635 |

FOREIGN PATENT DOCUMENTS

| | | | | |
|---|---|---|---|---|
| WO | WO-2017155544 A1 * | 9/2017 | .......... | G06N 3/0635 |
| WO | 2018007783 A1 | 1/2018 | | |

OTHER PUBLICATIONS

Notification Concerning Transmittal of International Preliminary Report on Patentability, App. No. PCT/GB2017/051734, Filed Jun. 14, 2017, dated Jan. 17, 2019, 11 Pages.

Prezioso, et al, "Training and operation of an intergrated neuromorphic network based on metal-oxide memristors," Dept. of Electrical and Computer Engineering, UCSB, CA, doi:10.1038/nature14441, 2015, 19 Pages.

Notification of Transmittal of International Search Report and Written Opinion of the International Searching Authority, or the Declaration, App. No. PCT/GB2017/051734, Filed Jun. 14, 2017, dated Oct. 2, 2017, 17 Pages.

Combined Search and Examination Report, App. No. GB1611857.2, Filed Jul. 7, 2016, dated Jan. 4, 2017, 9 Pages.

Alibart, et al, "Pattern classification by memristive crossbar circuits using ex situ and in situ training," Nature Communications, 4:2072, DOI: 10.1038/ncomms3072, www.nature.com/naturecommunications, Published Jun. 25, 2003, 15 Pages.

Yakopcic, et al, "Ex-Situ Programming in a Neuromorphic Memristor Based Crossbar Circuit," IEEE, 978-1-4673-7565-8, 2015, pp. 300-304.

Burr, et al, "Experimental Demonstration and Tolerancing of a Large-Scale Neural Network (165 000 Synapses) Using Phase-Change Memory as the Synaptic Weight Element," IEEE Transactions on Electron Devices, vol. 62, No. 11, Nov. 2015, pp. 3498-3507.

Shafiee, et al, "ISAAC: A Convolutional Neural Network Accelerator with In-Situ Analog Arithmetic in Crossbars," ACM/IEEE 43rd Annual International Symposium on Computer Architecture, 2016, pp. 14-26.

Park, et al, "Electronic system with memristive synapses for pattern recognition," Scientific Reports, www.nature.com/scientificreports, 5:10123, DOI: 10.1038/srep10123, Published May 5, 2015, 19 Pages.

Sheri, et al, "Neuromorphic Character Recognition System with Two PCMO Memristors as a Synapse," IEEE Transactions on Industrial Electronics, vol. 61, No. 6, Jun. 2014, pp. 2933-2941.

Vourkas, "Memristive Crossbar-Based Nonvolatile Memory," Circuits and Architectures, Emergence, Complexity and Computation 19, DOI 10.1007/978-3-319-22647-7_5, 2016, pp. 101-147.

* cited by examiner

NEURAL NETWORK INCLUDING MEMORY ELEMENTS IMPLEMENTED AT NODES

This application claims the benefit of priority to International Appl. No. PCT/GB2017/051734, filed on Jun. 14, 2017, and GB Appl. No. 1611857.2, filed on Jul. 7, 2016, which are assigned to the Assignee hereof and incorporated herein by reference in their entirety.

The present invention generally relates to artificial neural networks, and in particular to a non-volatile memory circuit for implementing an artificial neural network.

Non-volatile memory (NVM) is a class of memory in which the memory cell or element does not lose its state after power supplied to the cell/element is removed. Examples of non-volatile memory devices include flash memory, magnetic computer storage devices (e.g. hard disks, floppy disks, and magnetic tape), and optical discs. Other examples of NVM devices include phase change memory (PCM/PCRAM) devices, resistive random access memory (RRAM/ReRAM) devices, and Correlated Electron Material (CEM/CeRAM) devices. In a phase change memory device, programming (writing) involves heating the memory cell to melt it, (which causes a change in resistance) and cooling to either a conductive crystalline state or a non-conductive amorphous state. In a resistive RAM device, programming involves changing the resistance across a dielectric solid-state material. A CeRAM device is formed (wholly or in part) from a Correlated Electron Material (CEM), which exhibits an abrupt conductive or insulative state transition arising from electron correlations rather than solid state structural phase changes.

NVM elements may be used for neuromorphic computing.

Broadly speaking, the techniques described herein implement a dot-product computation of weights and input values in an artificial neural network (ANN). An ANN is formed of layers of interconnected artificial neurons (or neural network nodes), where the connections (or edges) are associated with a number/weight. The term "dot-product" used herein refers to the multiplication of a weight associated with each in-edge of, or connection into, a neural network node with the magnitude of the signal (e.g. voltage, current, etc.) along that in-edge. In some implementations, the weights and/or inputs may have negative magnitudes. The computation performed at each neural network node may occur in two distinct steps. The first step comprises summing the products of the weights and the input magnitudes (dot-product or the multiply-accumulate). The second step comprises using this sum as an input to an activation function of the neural network node. The activation function defines the output of the node given particular inputs, and could be binary (e.g. "fire" or "don't fire"). The present techniques provide hardware/circuitry for a low-power and energy-efficient implementation of the dot-product (multiply-and-accumulate) computation within an ANN.

According to a first aspect of the present technique, there is provided an apparatus for implementing a reconfigurable artificial neural network, the apparatus comprising: a crosspoint array comprising: at least one row signal line and at least one column signal line; at least one neural network node, wherein each neural network node is provided at an intersection of a row signal line and a column signal line, and wherein each neural network node has an associated weight; and a plurality of programmable non-volatile memory elements provided at each neural network node to store the associated weight, wherein each non-volatile memory element is switchable between a first impedance state and a second impedance state; a communication module configured to receive data specifying the weight for each neural network node of the crosspoint array; and control circuitry configured to switch the plurality of non-volatile memory elements provided at each neural network node into the first or the second impedance state to implement (or program) the weight at the neural network node.

According to a second aspect of the present technique, there is provided method of implementing a reconfigurable artificial neural network in a crosspoint array comprising at least one neural network node located at an intersection of a row signal line and a column signal line, the method comprising: receiving data specifying a weight for each neural network node of the crosspoint array; switching a plurality of non-volatile memory elements provided at each neural network node into a required impedance state to implement the specified weight at each neural network node; and storing, using the non-volatile memory elements, the weight for each neural network node of the crosspoint array.

According to a third aspect of the present technique, there is provided a system of implementing a reconfigurable artificial neural network, the system comprising: an apparatus as described herein; and a remote server configured to train an artificial neural network model; wherein the apparatus is configured to receive data specifying a weight for each neural network node of the apparatus from the remote server.

The techniques are diagrammatically illustrated, by way of example, in the accompanying drawings, in which:

FIG. 4b shows an equivalent circuit representation of the 2×2 crosspoint array module of FIG. 4a;

FIG. 11b shows a schematic version of FIG. 11a.

Broadly speaking, embodiments of the present techniques provide a reconfigurable hardware-based artificial neural network, wherein weights for each neural network node of the artificial neural network are obtained via training performed external to the neural network. The present techniques may be particularly useful for implementing artificial neural networks in resource-constrained devices, such as Internet of Things (IoT) devices or embedded devices which typically have limited processing and/or memory capabilities. Such constrained devices may not have the capabilities to train an artificial neural network. Thus, the present techniques provide ways of implementing an artificial neural network in a device (particularly constrained devices) without requiring the device to perform the training in situ. Weights for the artificial neural network are obtained by training a neural network remote to the device, such as in the cloud or a remote server having sufficient processing capabilities.

Figure 1A:
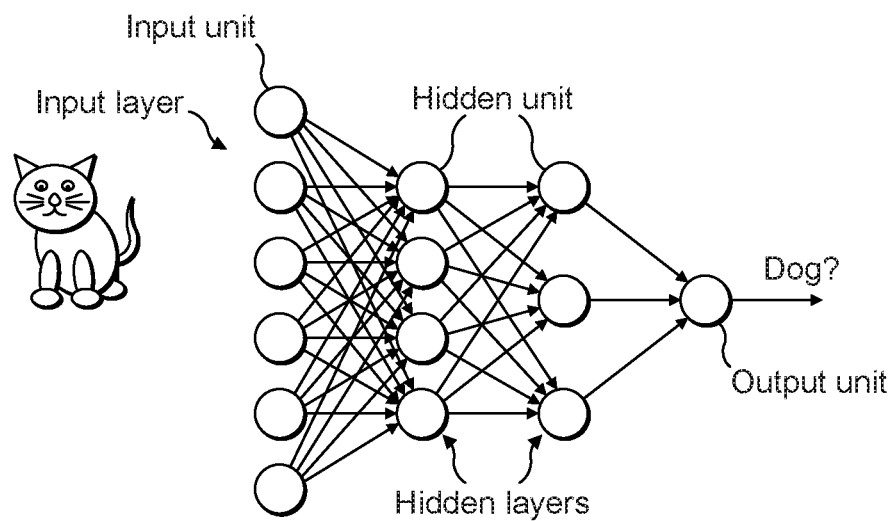
FIG. 1a shows a schematic of an example neural network for image recognition.

The concept of artificial neural networks is not described in detail herein. Nevertheless, a brief explanation is provided to aid understanding of the present techniques. Generally speaking, an artificial neural network (ANN) is a processing device (implemented in software, hardware, or a combination of both) that contains hundreds, thousands or even millions of processing units called "artificial neurons" (which are like the neurons in a human brain). The artificial neurons work in unison to solve specific problems. An ANN is typically organised in layers that comprise a number of interconnected artificial neurons. A basic ANN consists of three layers: a layer of "input" units that are connected to a layer of "hidden" units, where the hidden nodes are connected to a layer of "output" units. (In some cases, the layer of hidden units may not be present). FIG. 1a shows a schematic of an example artificial neural network. The input units of the input layer receive raw information/data that is to be processed by the ANN (or to be learnt/recognised during training of an ANN). The output units in the output layer are located on the opposite side of the ANN and signal how the ANN has processed the raw information. In between the input units and the output units are one or more layers of hidden units, which perform the majority of an ANN. (In FIG. 1a, two hidden layers are shown). In a fully connected ANN, each hidden unit and each output unit is connected to every unit in the layers either side, but this is merely one example type of ANN. The connections between one unit and another unit are represented by a number/weight. The weight may be positive (e.g. if one unit excites another unit), or negative (e.g. if one unit suppresses/inhibits another unit). Generally, the higher the weight, the more influence one unit has on another.

ANNs are often used for image and speech recognition tasks which are usually difficult tasks to solve using ordinary rule-based programming. In the example ANN shown in FIG. 1a, the ANN is used to perform image recognition, and in particular, to determine whether or not an image is of a dog. Thus, the output layer provides an output indicating whether or not a received image is (or contains) an image of a dog. The output may be a binary output e.g. "yes" is 1 and "no" is 0, or the output may indicate how likely it is that the received image is an image of dog. In the example of FIG. 1a, the input layer receives an image of a cat, and this is processed by the ANN to determine if the image is of a dog. ANNs may be used for alphanumeric character recognition, for example, and there may be an output for each possible character (e.g. a to z, and 0 to 9).

Figure 1B:
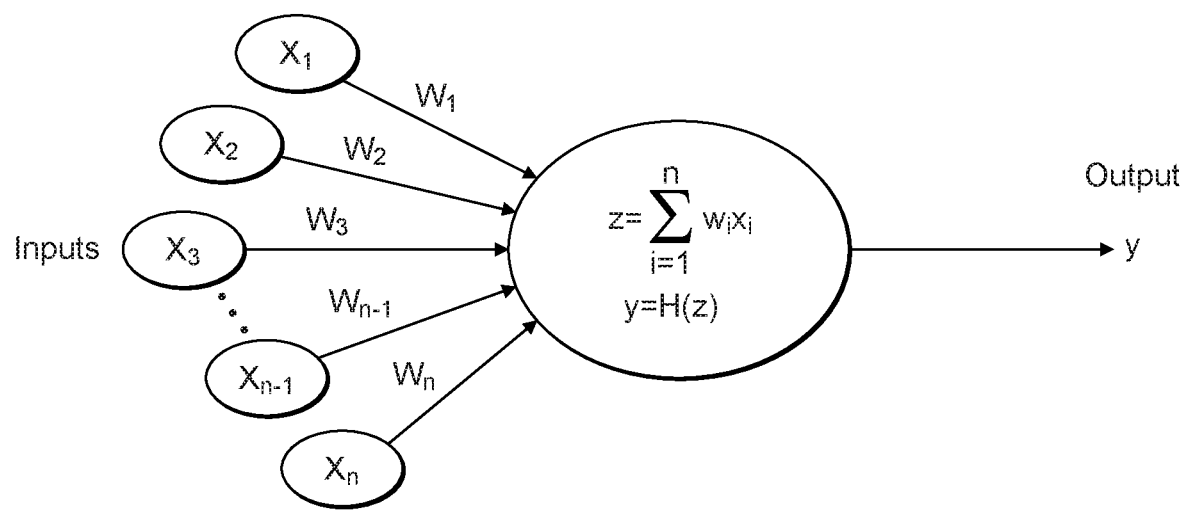
FIG. 1b shows a schematic diagram of a neural network inference function.

In embodiments of the present techniques, the artificial neural network may be configured to receive voltages at the input layer, and to output currents at the output layer. In FIG. 1a, the graphs (connections) in the ANN represent weights and the nodes represent the sum of the weighted inputs passed through a sigmoid function. The weighted sum of input nodes is a linear operation whereas the sigmoid function is essentially non-linear. Each node of an artificial neural network has in-edges (i.e edges pointing into the node) and out-edges (i.e. edges pointing of the node). Each edge pointing into a node comes either from another node, or from an input into the artificial neural network. Similarly, each artificial neural network (ANN), or each layer within a tiered ANN, has an in-edge and an out edge. FIG. 1b shows a schematic diagram of a neural network inference function. In the example shown in FIGS. 1a and 1b, both the input and the output nodes can be thought of data values upon which the following computation is undertaken (see Equation 1):

$$z = \sum_{i=1}^{n} w_i x_i$$

$$y = H(z)$$

Equation 1

In matrix formulation, the linear computation of the above computation (Equation 1) can be written as follows:

$$Z = W^T X$$

Equation 2

In the present techniques, if the input nodes (X) of an ANN are expressed in terms of voltages V and the output nodes (Z) are expressed in terms of currents I, then the matrix W is equivalent to an admittance matrix. As such to relate output current and input voltage matrices, it is possible to rewrite Equation 2 as:

$$I = Y^T V$$

Equation 3

Memristor or ReRAM-based crosspoint array architectures may be used for neuromorphic computing. Generally speaking, the architectures may be used to convert input nodes representing voltages into output nodes representing currents, and/or to convert input nodes representing currents into output nodes representing voltages. In the following, it will be understood that reference to converting current to voltage (or vice versa) is merely used as an illustrative example, and that the present techniques may equally be used to convert voltage to current (or vice versa). The output currents are usually determined by passing the input voltages through a conductance matrix implemented in the crosspoint array. The conductance matrix is implemented by taking advantage of the "analogue" nature of particular non-volatile memory elements such as memristors and ReRAM. Analogue non-volatile memory elements are filamentary in nature. Consequently, depending upon the application of a suitable voltage, the actual resistance value provided by an analogue non-volatile memory element can be controlled in fine steps between a high resistance state (HRS) or a low resistance state (LRS). However, there are usually inherent variations in the resistance values of these filamentary non-volatile memory elements. Thus, crosspoint arrays formed from filamentary non-volatile memory elements tend to require careful and precise tuning in situ, on an element-by-element basis, to minimise any error between the target admittance and a measured admittance. Hence, this approach is inherently "analogue" by nature.

Accordingly, ANNs which are formed of crosspoint array architectures comprising filamentary resistive elements cannot take advantage of cloud-based or remote neural network training, because these ANNs necessarily have to be trained in situ to take into account variations between each resistive element. Thus, they are unsuitable for use in Internet of Things (IoT) devices where the constrained processing, energy and memory capacity of the devices make in situ training difficult or impossible. Furthermore, these ANNs may not be suitable for re-use for different applications (e.g. character recognition, speech recognition, etc.) since each application will require its own specific weights, and switching the filamentary, analogue ANN from one application to another would require the ANN to be retrained and tuned in situ.

Due to their analogue nature, such approaches are susceptible to variations in the resistance values. The variations in the intermediate resistance values may be even greater than the overall difference between the HRS and the LRS.

The artificial neural network of the present techniques is formed using a plurality of non-filamentary non-volatile memory elements to store weights. The non-filamentary non-volatile memory elements overcome the problems described above and may enable artificial neural networks to be implemented in constrained devices such as IoT devices without requiring in situ training. This may enable artificial neural networks to be implemented in IoT devices quickly and efficiently, as each IoT device may simply download weights for a specific application. The crosspoint arrays of the present techniques which are used to encode weights and perform a dot-product computation are all-digital, which enables the ANN to take advantage of cloud-based training. (However, as explained below, the ANN may comprise circuitry to compute an activation function, and in embodiments, this circuitry may not be all-digital). Broadly speaking, data (e.g. digital words) specifying weights for a specific application may be downloaded by an IoT device and programmed into a crosspoint array provided within the IoT device. This may eliminate the need for expensive and time-consuming ANN training in each IoT device. The all-digital approach may also provide greater immunity against resistance variability and hence, provides an ANN suitable for realistic applications.

In embodiments of the present techniques, each artificial neural network node of the crosspoint array may comprise a correlated electron switch (CES) element. A CES element is uniquely differentiated from memristors and ReRAMs due to its "non-filamentary" nature, which allows the existence of (at least) two distinct and fixed impedance states after fabrication. Since a CES element is restricted to distinct impedance states, replacing the memristors and ReRAMs with CES elements in known crosspoint array based ANNs will not give rise to the advantages of the present techniques, because these known ANNs utilize the filamentary nature of memristors to provide a variety of resistance states (and thereby, a variety of weights). In the present techniques, a spectrum of resistance/impedance states may be created through the usage of multiple CES elements.

As mentioned above, each neural network node of the crosspoint array of the present techniques may comprise a correlated electron switch (CES) element. In this context, a CES element may exhibit an abrupt conductor/insulator transition from a conductive state (a low impedance and low capacitance state) to an insulative (high impedance and high capacitance state) state, or vice versa, arising from electron correlations in the CEM rather than solid state structural phase changes (e.g., crystalline/amorphous changes as occurs in phase change memory (PCM) devices or filamentary formation as occurs in resistive RAM devices).

In embodiments, the abrupt conductor/insulator transition in a CEM may be responsive to a quantum mechanical phenomenon, in contrast to melting/solidification or filament formation. Such a quantum mechanical transition between conductive and insulative states in a CES element may be understood in any one of several aspects.

In embodiments, the quantum mechanical transitions between an insulative and conductive states may be understood in terms of Mott transitions. For example, a CEM may switch from an insulative state to a conductive state if a first Mott transition condition is met and may switch from a conductive state to insulative state if a second Mott transition condition is met. The different Mott transition conditions will be described in further detail below.

In particular implementations of embodiments of the present techniques, a memory circuit may comprise: a memory array including at least one CES element; a write circuit for placing the CES element in a first memory state or a second memory state depending on signals provided to the memory array (or to a memory block within the memory array), wherein an impedance of the CES element is higher in the second memory state than in the first memory state; and a read circuit for sensing the memory state of the memory array (or block) and providing an electrical signal corresponding to the sensed memory state of the memory array (or block).

In one aspect, the impedance of the CES element in the second impedance state may be more than 100 times greater than the impedance of the CES element in the first impedance state.

The CES element may function as a CES random access memory (CeRAM). The CES element comprises a material that may transition between or among a plurality of predetermined detectable memory states based, at least in part, on at least a portion of the CEM transitioning between memory states (e.g. from an insulative to a conductive state) utilizing, for example, a Mott transition. In this context, a "memory state" means a detectable state of the CES element that is indicative of a value, symbol, parameter or condition, just to provide a few examples.

In one particular implementation, a memory state of the CES element may be detected based, at least in part, on the value of a signal detected on one or more the terminals of the CES element in a "read operation".

In another particular implementation, the CES element may be placed in a particular memory state to represent or store a particular value, symbol, parameter or condition etc. by controlling the bias parameters (e.g. voltage) applied to the CES element and/or by controlling the current parameters (e.g. current density $J(A/\mu m^2)$ driven through the CES element.

In an embodiment, the CEM comprises a switching region (S) arranged in electrical contact with (e.g. sandwiched between) conductive regions (C), in a (C/S/C) arrangement on a semiconductor (e.g. in a stack arrangement). The conductive region (C) may comprise any suitable material, and may comprise a transition metal oxide, and may further include any material comprising metal-like characteristics, including, for example, polysilicon or a doped semiconductor. In embodiments, the conductive region (C) may additionally or alternatively comprise a material selected from a group comprising aluminium, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

According to an embodiment, the switching region (S) may comprise any transition metal oxide (TMO) material, such as, for example, perovskites, Mott insulators, charge exchange insulators, and Anderson disorder insulators.

In particular implementations, the switching region (S) material may include switching materials such as nickel oxide, cobalt oxide, iron oxide, yttrium oxide, and perovskites such as Cr doped strontium titanate, lanthanum titanate, and the manganate family including praesydium calcium, manganate, and praesydium lanthanum manganite, just to provide a few examples. In particular, oxides incorporating elements with incomplete d and f orbital shells may exhibit sufficient resistive switching properties for use as a switching region (S) material. In an embodiment, the CES element may be prepared without electroforming.

Other implementations may employ other transition metal compounds as the switching region (S) material without deviating from claimed subject matter. For example, $\{M(ch \times n)_2 Br\}Br_2$ where M may comprise Pt, Pd, or Ni, and ch×n comprises 1R, 2R-cyclohexanediamine, and other such metal complexes may be used without deviating from claimed subject matter.

In one aspect, the CEM may comprise materials that are transition metal oxide (TMO) variable resistance materials, though it should be understood that these are exemplary only, and are not intended to limit claimed subject matter.

Particular implementations may employ other variable resistance materials as well. Whilst nickel oxide, NiO, is disclosed as one particular TMO above, NiO materials may also be doped with extrinsic ligands, which may stabilize variable resistance properties. In particular, NiO variable resistance materials disclosed herein may include a carbon containing ligand, which may be indicated by NiO(Cx). Here, one skilled in the art may determine a value of x for any specific carbon containing ligand and any specific combination of carbon containing ligand with NiO simply by balancing valences. In another particular example, NiO doped with extrinsic ligands may be expressed as NiO(Lx), where Lx is a ligand element or compound and x indicates a number of units of the ligand for one unit of NiO. One skilled in the art may determine a value of x for any specific ligand and any specific combination of ligand with NiO or any other transition metal simply by balancing valences.

Furthermore, the terminals may comprise the same materials as the conductive regions (C), such that the conductive regions (C) may function as the terminals. In embodiments where the material for the terminals and the conductive regions (C) are not the same, it is preferable that the different materials are matched to reduce the effects of border interactions or surface defects which may otherwise affect performance of the CES element. For example, the materials should be matched to ensure the electrical properties (e.g. conductivities) and/or chemical properties (e.g. coefficients of thermal expansion match) of the CEM and terminals do not negatively impact the operation of the CES element.

By applying a specific voltage ($V_{applied}$) between the terminals and driving a specific current density ($J_{applied}$) through the CEM, the CES element may transition from a conductive (low impedance and low capacitance) memory state, hereinafter "LIS", to an insulative (high impedance and high capacitance) memory state, hereinafter "HIS", or may transition from a HIS to an LIS in accordance with a different applied voltage ($V_{applied}$) and current density ($J_{applied}$).

In this context, it should be understood that LIS and HIS are relative terms and not specific to any particular quantity or value for conductance, impedance, or capacitance. For example, whilst in a first memory state the CES element may be more conductive (or less insulative), than while the CES element is in a second memory state.

Furthermore, CES elements are "born on", whereby when fabricated (e.g. deposited), the CES element is in a LIS.

Figure 2:
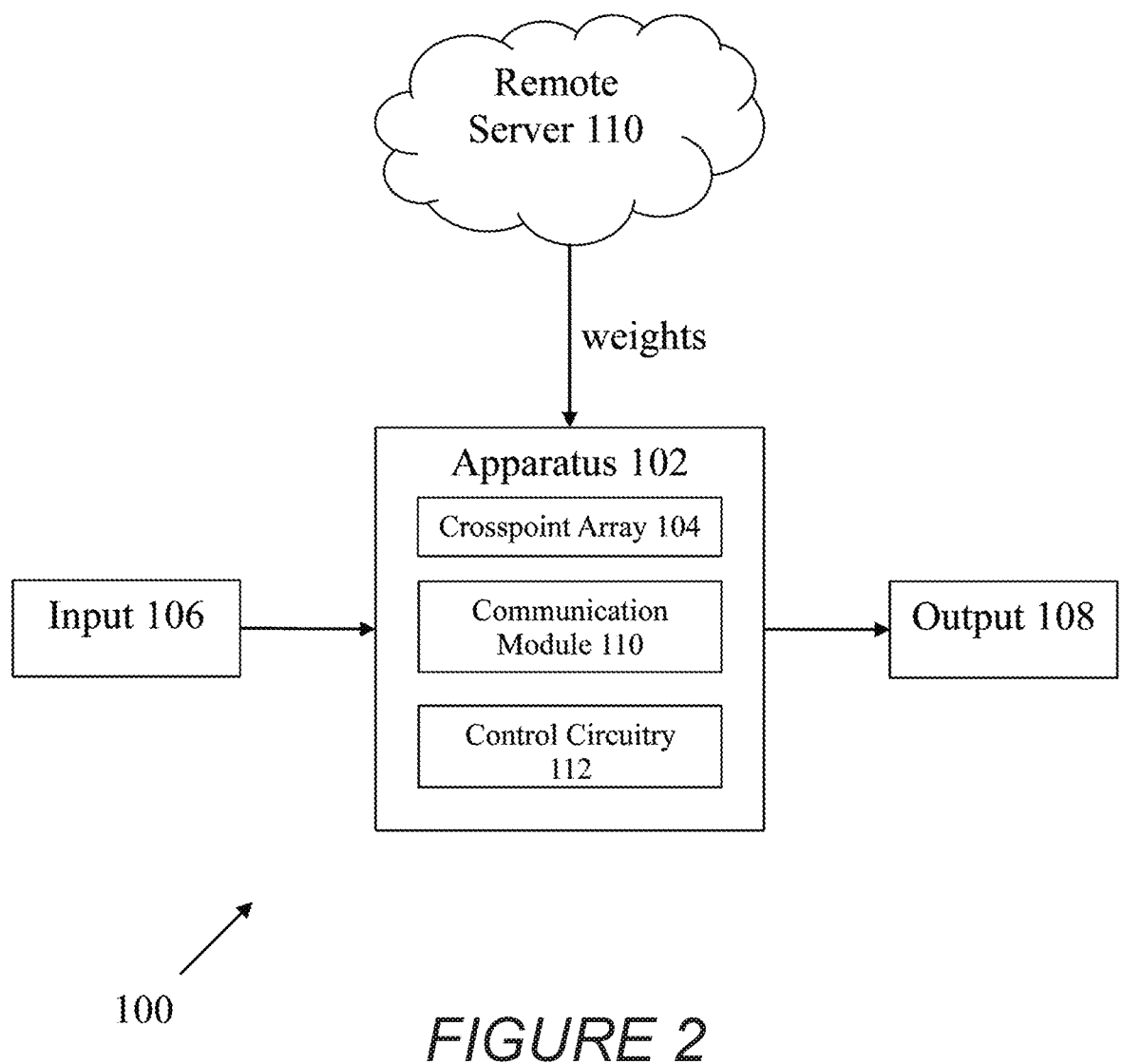
FIG. 2 shows a block diagram of a system to implement a neural network in an apparatus.

Turning now to FIG. 2, this shows a block diagram of a system 100 to implement a neural network in an apparatus 102. As explained above, the artificial neural network is provided in apparatus 102 and is formed using at least one crosspoint array 104. The crosspoint array 104 comprises at least one row signal line and at least one column signal line, at least one neural network node (neuron) is provided at an intersection of a row signal line and column signal line. The neural network node has an associated weight, which is stored using a plurality of programmable non-volatile memory elements provided at each neural network node. The weight for each neural network node is obtained via neural network training performed in a remote server 110. The weights may be provided to, or downloaded by, a communication module 110 of the apparatus 102. The apparatus 102 may use control circuitry 112 to determine how to program the received weights into the crosspoint array 104 in order to implement the artificial neural network for a particular application (e.g. speech recognition, character/image recognition, etc.) When the crosspoint array 104 has been programmed based on the received weights, an input 106 (e.g. voltages, currents, or other signals representing an image, sound, etc.) may be input into the apparatus 102. The input 106 is processed by the crosspoint array 104 and at least one output 108 is generated.

Accordingly, there is provided an apparatus for implementing a reconfigurable artificial neural network, the apparatus comprising: a crosspoint array comprising: at least one row signal line and at least one column signal line; at least one neural network node, wherein each neural network node is provided at an intersection of a row signal line and a column signal line, and wherein each neural network node has an associated weight; and a plurality of programmable non-volatile memory elements provided at each neural network node to store the associated weight, wherein each non-volatile memory element is switchable between a first impedance state and a second impedance state; a communication module configured to receive data specifying the weight for each neural network node of the crosspoint array; and control circuitry configured to switch the plurality of non-volatile memory elements provided at each neural network node into the first or the second impedance state to apply implement the weight to at the neural network node.

The crosspoint array may be used to perform the first step, i.e. summing the dot-product computation of weights and input values/signals, for each neural network node of an artificial neural network (ANN). In embodiments, the apparatus may comprise further circuitry to perform the second step, the computation of the activation function, which uses the sum from the first step as input into an activation function for the neural network node.

The term "non-volatile memory element" is used interchangeably herein with the terms "NVM element", "non-volatile memory device", "non-volatile random access memory", "non-volatile memory cell", "non-volatile memory array", or "non-volatile memory". In embodiments, the non-volatile memory element may be a non-polar NVM element, in which switching and conduction can take place in any direction (e.g. bipolar switching), and the term "non-volatile memory element" is used interchangeably herein with the term "non-polar NVM element". In embodiments, the non-volatile memory element may be a memristor, a resistive random access memory (ReRAM), a phase-change memory (PCM), and/or spin-transfer torque magnetic random-access memory (STT-MRAM or STT-RAM), and the term "non-volatile memory element" is used herein to refer to any of these types of memory. In embodiments, the non-volatile memory element is a correlated electron switch (CES), and the term "non-volatile memory element" is used interchangeably with the terms "Correlated Electron Material memory", "CeRAM", "Correlated Electron Switch", "CES", or "bipolar switching non-volatile memory element".

In embodiments, the communication module of the apparatus is configured to receive data specifying the weight for each neural network node and is configured to: obtain at least one data packet specifying the weights for each neural network node; and extract, from the data packet, the weight for each neural network node; and wherein the control circuitry is configured to: determine, using the weight for each neural network node, whether each non-volatile memory element at each neural network node is to be switched into the first impedance state or the second impedance state; and generate, responsive to the determination, a programming signal for each non-volatile memory element.

The control circuitry may comprise write circuitry configured to: receive the generated programming signal for each non-volatile memory element; and drive each non-volatile memory element dependent on the generated programming signal.

Figure 3:
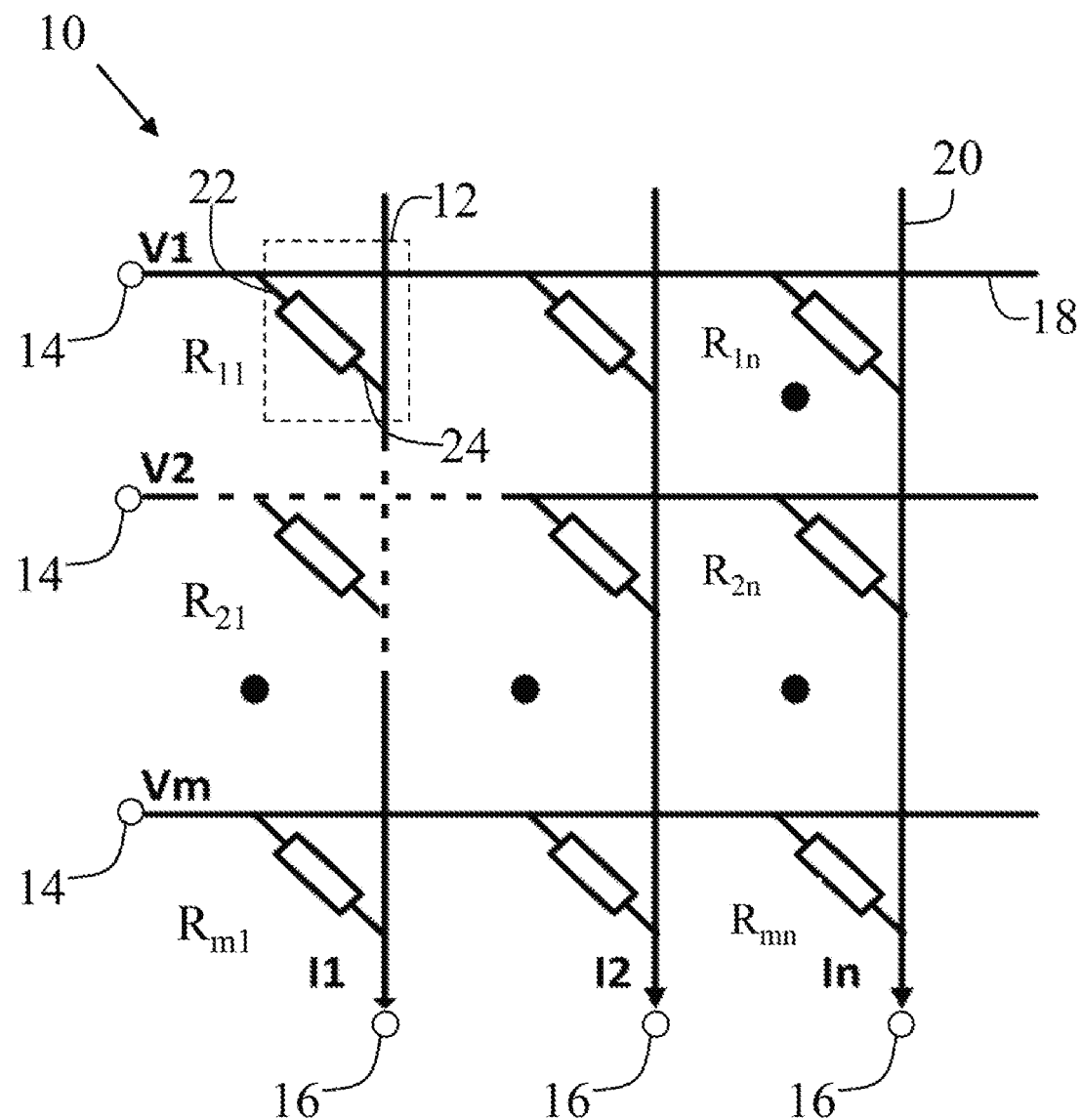
FIG. 3 shows a circuit diagram of a neural network implemented using a crosspoint array, where each neural network node comprises a crosspoint array module formed of a plurality of non-volatile memory elements.

FIG. 3 shows a circuit diagram of an artificial neural network (ANN) implemented using at least one crosspoint array 10. The crosspoint array 10 comprises at least one row signal line 18 and at least one column signal line 20. In the illustrated example, the crosspoint array comprises a plurality of row signal lines 18 and a plurality of column signal lines 20. As mentioned earlier, an ANN comprises an input layer and therefore, the crosspoint array 10 comprises one or more input nodes 14. Each input node 14 is coupled to a row signal line 18. An ANN comprises an output layer and therefore, the crosspoint array comprises one or more output nodes 16, where each output node is coupled to a column signal line 18. In embodiments (now shown), the crosspoint array 10 may comprise a plurality of input nodes 14 and a single output node 16. The number of output nodes 16 may depend on the application being implemented by the ANN. For example, many output nodes 16 may be required for an ANN that is implementing alphanumeric character recognition (i.e. one for each character). In another example, a single output node 16 may be sufficient if the ANN is implementing a specific image recognition application, e.g. facial recognition.

The crosspoint array 10 comprises a neural network node 12 provided at each intersection of a row signal line 18 and a column signal line 20. In the illustrated example, the crosspoint array 10 is a M×N array and comprises a plurality of neural network nodes 12, labelled R11 to Rmn. In embodiments, M and N are different integer numbers, and in alternative embodiments, M and N are equal. A plurality of programmable non-volatile memory elements is provided at each neural network node 12 to store a weight associated with the neural network node 12. Each non-volatile memory element is switchable between a first impedance state and a second impedance state, and which state is selected is dependent on the weight to be stored in the neural network node 12. In the case of the non-volatile memory element being a correlated electron switch, there may, in embodiments, be only two possible impedance states: a high impedance state (HIS) or a low impedance state (LIS). Each neural network node 12 comprises a neural network node input 22 (also referred to herein as an "input edge" or "in-edge") and a neural network node output 24 (also referred to herein as an "output edge" or "out-edge").

Thus, in embodiments the crosspoint array may further comprise: at least one input terminal to receive an input signal for the crosspoint array; and at least one output terminal to provide an output signal generated by passing the input signal through at least one neural network node of the crosspoint array. The neural network node may receive the input signal, multiply the associated weight of the neural network node with the input signal, and output a weighted signal.

Alternatively, the crosspoint array may comprise: a plurality of row signal lines and a plurality of column signal lines; a plurality of neural network nodes, wherein each neural network node is provided at an intersection of a row signal line and a column signal line, and wherein each neural network node has an associated weight; and a plurality of programmable non-volatile memory elements provided at each neural network node, wherein each non-volatile memory element is switchable between a first impedance state and a second impedance state.

The crosspoint array may further comprise: a plurality of input terminals (or input nodes), each input terminal configured to receive an input signal for the crosspoint array; and at least one output terminal (or output node) to provide an output signal generated by passing the input signals through the neural network nodes of the crosspoint array. The crosspoint array may comprise a plurality of output terminals, each output terminal providing an output signal.

Each neural network node may receive two or more input signals, multiply the associated weight with each input signals to generate weighted signals, and output a summed signal representing the summed weighted signals. The multiplication may be a dot-product calculation of the weight and the input signal. The at least one output terminal of the crosspoint array may be configured to receive a summed signal from one or more of the plurality of neural network nodes, and to combine the summed signals to provide the output signal.

The crosspoint array 10 may be configured to receive voltages (voltage values) at each input node 14, e.g. V1 to Vm, and may be configured to output currents (current values) at each output node 16, e.g. I1 to In. In alternative embodiments, the crosspoint array 10 may be configured to receive currents and to output voltages.

Figure 4A:
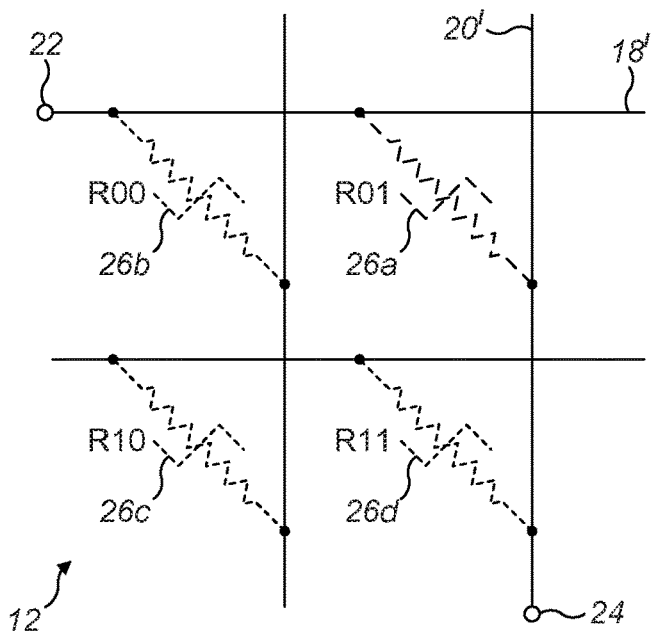
FIG. 4a shows a circuit diagram of an example 2×2 crosspoint array module provided at each neural network node.
Figure 4B:
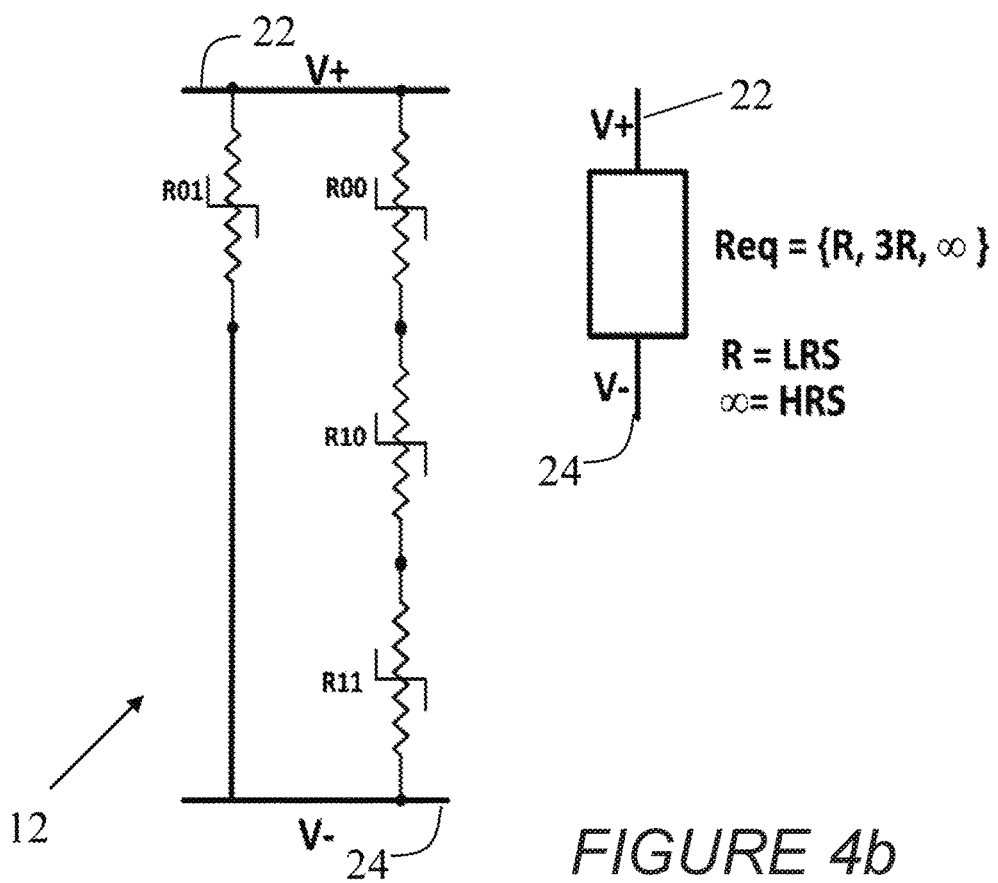

In embodiments, each neural network node 12 of the crosspoint array 10 may comprise a crosspoint array module (not as shown in FIGS. 4a and 4b, 3 and described in more detail below). The crosspoint array module comprises an array of N row single lines and M column signal lines, with a non-volatile memory element provided at each intersection of the row and column signal lines. Within each crosspoint array module, there is a direct path from the neural network node input 22 (in-edge) to the neural network node output 24 (out edge), and at least one indirect path from the neural network node input 22 to the neural network node output 24. The direct path passes through a single, or a minimum number of, NVM elements or, in other words, through a selected cell/portion of a crosspoint array. The indirect path is a sneak leakage path through unselected cells or portions of a crosspoint array. In this embodiment, the direct and sneak leakage paths in the crosspoint array module are exploited to create a range of resistance (R) values that can be encoded digitally.

In embodiments, each neural network node may comprise a crosspoint array module, and the plurality of programmable non-volatile memory elements provided at each neural network node are arranged in the crosspoint array module.

Thus, in embodiments, the present techniques provide a "tiered", fully-connected crosspoint array architecture that may achieve a multi-bit digital encoding of a resistance matrix. The sneak leakage paths across the crosspoint array 10 may provide a linear increase in equivalent resistance values that may enable an all-digital encoding of a resistance matrix. This embodiment is described in more detail with reference to FIGS. 4a to 7 below.

In alternative embodiments, each neural network node 12 of the crosspoint array 10 may comprise a crosspoint array module (not shown in FIG. 3) which comprises two or more non-volatile memory elements arranged in a parallel connection between the neural network node input 22 to the neural network node output 24. In this embodiment, the parallel connection of non-volatile memory elements in each neural network node 12 is used to create a range of conductance (G) values that can be encoded digitally. Thus, in embodiments, the present techniques provide a multi-element parallel-connected crosspoint array, where the parallel connection of the non-volatile memory elements may provide an all-digital encoding of an admittance/conductance matrix. This embodiment is described in more detail with reference to FIGS. 8 and 9 below.

In embodiments, the weight associated with each neural network node is a negative weight. In embodiments the first impedance state is a high impedance state, and the second impedance state is a low impedance state.

The non-volatile memory element may be a bipolar switching non-volatile memory element. In embodiments, the non-volatile memory element is any one of: a memristor, a resistive random access memory (ReRAM), a phase-change memory (PCM), and a spin-transfer torque magnetic random-access memory (STT-MRAM). Preferably, the non-volatile memory element is a correlated electron switch (CES).

The communication module of the apparatus may be configured to receive data specifying the weight for each neural network node of the crosspoint array from an artificial neural network model trained external to the apparatus, e.g. from a remote server or the cloud.

As the ANN of the present techniques is reconfigurable for different applications, the communication module may be configured to receive further data specifying a further weight for each neural network node of the crosspoint array, wherein the further weight is obtained from a machine learning technique or statistical model trained external to the apparatus. The further weight may be obtained from a further ANN model trained external to the apparatus, or from other statistical models, such as a hidden Markov model (HMM).

The apparatus may comprise a data store coupled to the communication module and configured to store the received data. Storing the received data may enable the apparatus to switch between different applications more readily, as the weights for each ANN application may be retrievable from a local data store when required.

The apparatus may be configured to receive instructions indicating a particular artificial neural network is to be implemented in the apparatus. Responsive to the instructions, the control circuitry may be configured to: retrieve, from the data store, the data corresponding to the artificial neural network indicated in the received instructions; and use the retrieved data to extract a weight for each neural network node of the crosspoint array.

All-Digital Multi-Bit Resistance Matrix

As mentioned above, each neural network node 12 of the crosspoint array 10 may comprise a crosspoint array module. FIG. 4a shows a circuit diagram of an example crosspoint array module provided at each neural network node 12. In this embodiment, the crosspoint array architecture 10 is used to generate a linear scale of resistance values, by taking advantage of sneak leakage paths in the crosspoint array. Generating a linear scale of resistance values may enable the actual resistance values (or weightings) for each artificial neural network to be digitally encoded and programmed into the crosspoint array.

The crosspoint array module shown in FIG. 4a comprises a 2×2 array of row signal lines 18' and column signal lines 20', with a non-volatile memory element 26a-26d provided at each intersection of the row and column signal lines. The crosspoint array module shown in FIG. 4a is merely exemplary, and in embodiments, may comprise more than two row signal lines and/or more than two column signal lines. In embodiments, the number of row signal lines and column signal lines may not be equal (i.e. the crosspoint array module may comprise a non-square array or row and column signal lines). In embodiments, the crosspoint array module may comprise an array of "n" row and "m" column signal lines, where n and m are integers, and where n and m may be equal or different. We refer to such an array as an n×m dimensional crosspoint array.

Within the crosspoint array module of neural network node 12, there is a direct path from the neural network node input 22 to the neural network node output 24. The direct path is through non-volatile memory element 26a. In the crosspoint array module there is at least one indirect path (a sneak leakage path) from the neural network node input 22 to the neural network node output 24. The indirect, sneak leakage path is through non-volatile memory element 26b, then non-volatile memory element 26c, and then through non-volatile memory element 26d. In other words, the sneak leakage path is through the series connection of non-volatile memory elements 26b, 26c and 26d. In this embodiment, the direct and sneak leakage paths in the crosspoint array module are exploited to create a range of resistance (R) values that can be encoded digitally.

In FIG. 4a, the equivalent resistance through the crosspoint array module is measured between the neural network node input 22 and the neural network node output 24. In this crosspoint array module, only input 22 and output 24 are connected to other parts of the crosspoint array 10, but other arrangements comprising more inputs and outputs may be possible.

FIG. 4b shows an equivalent circuit representation of the 2×2 crosspoint array module of FIG. 4a. The equivalent resistance between neural network node input 22 and neural network node output 24 is labeled as Req in FIG. 4b and is essentially a tuple. If a non-volatile memory element (e.g. a CES element) is in the low resistance state (LRS, or LIS), its resistance is labeled as "R". If a non-volatile memory element is in the high resistance state (HRS, or HIS), the resistance of the conducting path through the crosspoint array module is at least two orders of magnitude higher than the LRS and is therefore approximated as "infinity", or effectively open circuit.

When the NVM element used is a CES (Correlated Electron Switch), the HRS and LRS are separated by at least two orders of magnitude. In embodiments where other types of NVM elements are used, the separation between HRS and LRS may not be as large. In such a case, a series transistor may also be used as a proxy for "open-circuit" resistance. In the following equations, the variable "R" is used to denote the LRS resistance.

$$Req = R \quad \text{(a)}$$
(when $R01 = LRS$, and
any or all of $R00, R10, R11 = HRS$)

$$Req = 3R \quad \text{(b)}$$
(when $R01 = HRS$ and $R00 = R10 = R11 = LRS$)

$$Req = \frac{3R}{4} \quad \text{(c)}$$
(when $R01 = LRS$ and $R00 = R10 = R11 = LRS$)

Hence, $Req = \{R, 3R, \infty\}$ \hfill Equation 4

In embodiments of the present techniques, the aim is to achieve a linear mapping between the resistance/impedance values and the digitally-encoded representation. Hence, some embodiments discussed below do not make use of the fractional weights (i.e. as shown in Equation 4(c) above). However, in alternative embodiments, where the linearity requirement is less stringent, fractional weights may also be used. The present techniques exploit the resultant linearity as a means of design and usage simplification (and may, in embodiments, also use fractional weights).

Thus, the direct and the sneak resistance paths have enabled a linear resistance scale. The resistances of a 2×2 crosspoint array module can be digitally encoded with a single bit. (Note that in embodiments, the non-linear resistance separation—0.75R—may be discounted, as it may not be encoded digitally. However, in embodiments, the non-linear resistance separation(s) may be utilized).

Figure 5:
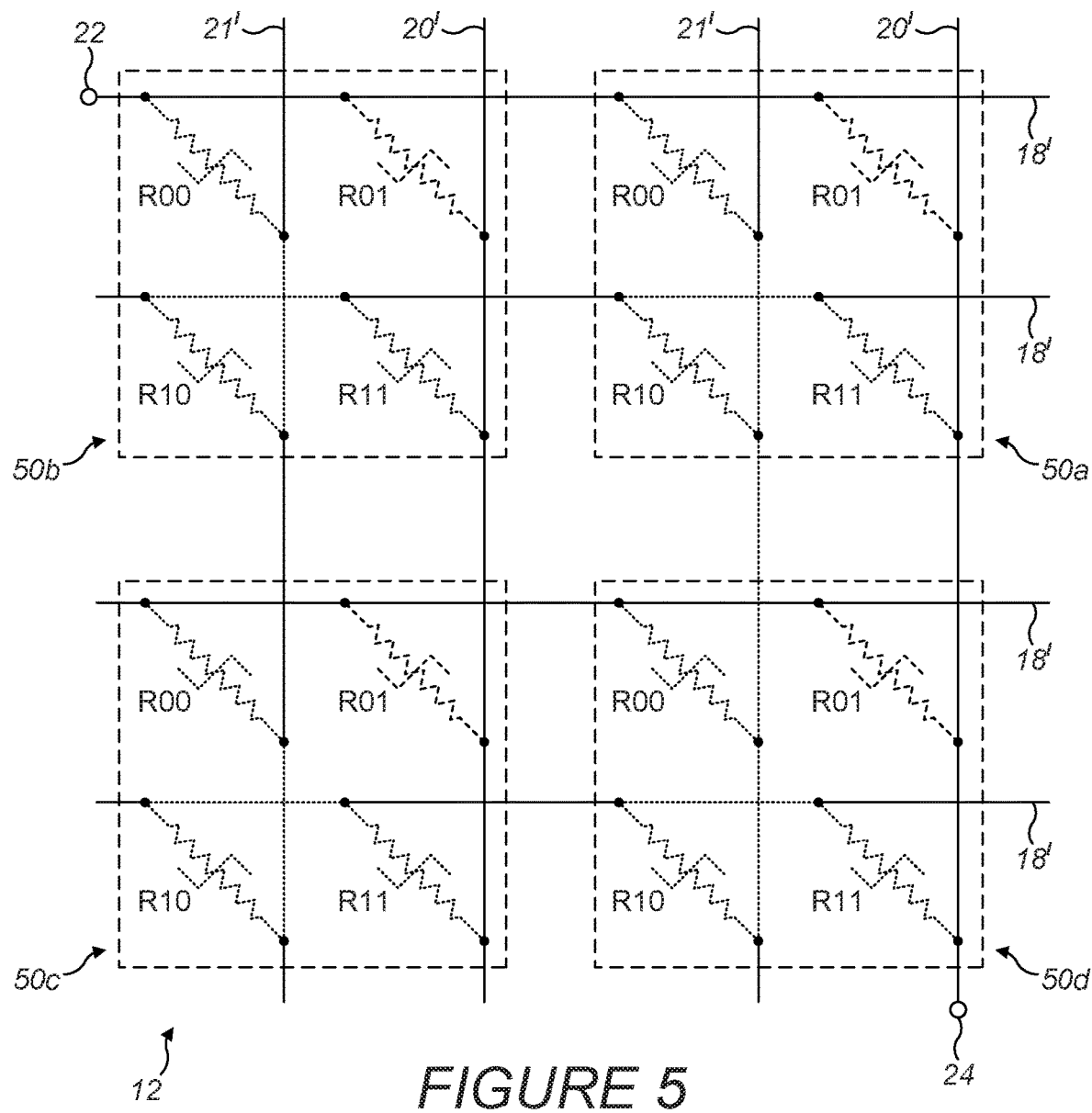
FIG. 5 shows a circuit diagram of an example 4×4 crosspoint array module provided at each neural network node.

Larger crosspoint array modules may be used to provide larger/wider resistance ranges and thereby, a multi-bit resistance code. FIG. 5 shows a circuit diagram of an example 4×4 crosspoint array module provided at each neural network node 12. The crosspoint array module shown in FIG. 5 comprises a 4×4 array of row signal lines 18' and column signal lines 20' and 21', with a non-volatile memory element provided at each intersection of the row and column signal lines. The 4×4 crosspoint array module may be constructed using the 2×2 crosspoint array module of FIG. 4a as a building block. The dashed boxes shown four 2×2 crosspoint array modules 50a to 50d. Each 2×2 building block 50a to 50d operates in a similar way to the 2×2 crosspoint array module described above with reference to FIGS. 4a and 4b. For example, in building block 50b, there is a direct path through building block 50b through non-volatile memory element R01, and an indirect path through non-volatile memory elements R00, R10 and R11.

There are two direct paths through the crosspoint array module, from neural network node input 22 to the neural network node output 24. One direct path through the 4×4 crosspoint array module is through non-volatile memory element R01 in building block 50a, and the other direct path is through the non-volatile memory elements R00, R10 and R11 in building block 50a. Thus, the direct path may have values R or 3R. There are many indirect, sneak leakage paths through the 4×4 crosspoint array module, depending on how many building blocks are passed through. For instance, 3R may be achieved by passing through R00, R10 and R11 of building block 50b only, and 5R may be achieved when the equivalent resistances through building block 50b is R, 50c is 3R and 50d is R. Accordingly, the 4×4 crosspoint array module may be able to provide the following equivalent resistances between neural network node input 22 and neural network node output 24:

$$Req = \{R, 3R, 5R, 7R, 9R, \infty\} \hfill \text{Equation 5}$$

As before, here "R" indicates the value of LRS resistance in an NVM element.

Thus, the direct and the sneak resistance paths in the 4×4 crosspoint array module have enabled a linear resistance scale, which can be digitally encoded with three bits. (Note that in embodiments, the non-linear resistance separations may be discounted, as they may not be readily encoded in a digital form. However, in embodiments, the non-linear resistance separation(s) may be utilized).

An 8×8 crosspoint array module may be required to provide a fully populated 3-bit encoding space. In this case, the resistance scale will be composed of the following values (where "R" indicates the value of LRS resistance in an NVM element):

$$Req = \{R, 3R, 5R, 7R, 9R, 11R, 13R, 15R, \infty\} \hfill \text{Equation 6}$$

The composite 4×4 crosspoint array module of FIG. 5 may be constructed using two metal layers (i.e. one metal layer for the column signal lines, and one metal layer for the row signal lines) without requiring further layers of metal. As shown in FIG. 5, the row signal lines 18' and even column signal lines 20' are continuous, while the odd column signal lines 21' are discontinuous. The discontinuous column signal lines 21' are used to enable the writing of each non-volatile memory element in the crosspoint array module.

In embodiments, the crosspoint array module of each neural network node may comprise an array formed of N row signal lines and M column signal lines, wherein one of the plurality of non-volatile memory elements is provided at each intersection of the N row signal lines and M column signal lines. Each crosspoint array module may comprise: a direct path from a neural network node input to a neural network node output; and at least one indirect path from the neural network node input to the neural network node output.

In particular embodiments, the crosspoint array modules may be used to digitally encode a linear scale of impedance values in the crosspoint array.

The at least one indirect path between the neural network node input to the neural network node output may be formed of two or more non-volatile memory elements in a series connection.

The crosspoint array may be configured to convert voltage to current. In such embodiments, each input terminal of the crosspoint array may be configured to receive a voltage and each output terminal of the crosspoint array may be configured to output a current.

Figure 6:
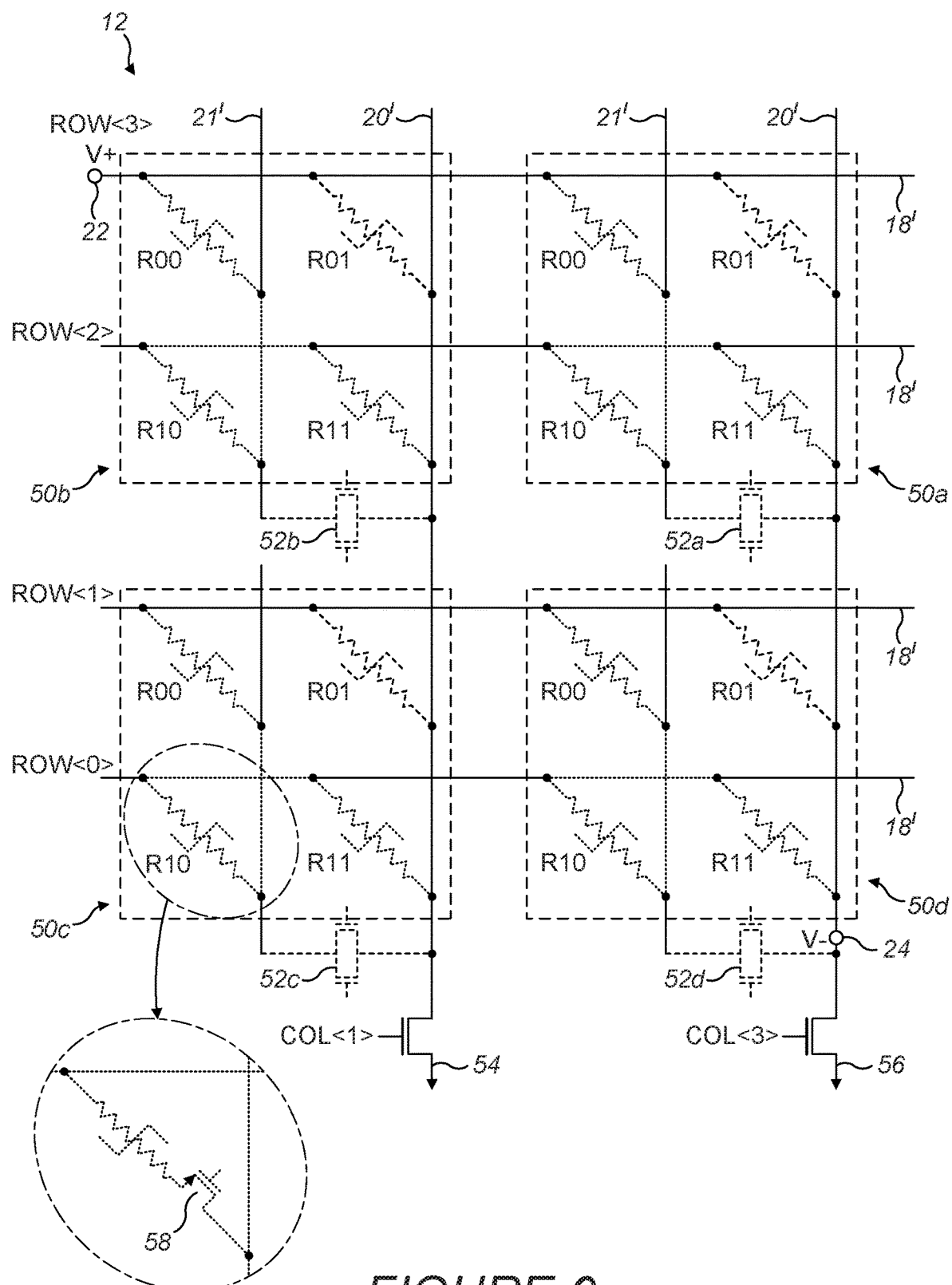
FIG. 6 shows a circuit diagram of an example 4×4 crosspoint array module comprising write circuitry.

FIG. 6 shows a circuit diagram of an example 4×4 crosspoint array module comprising control circuitry to drive each non-volatile memory element into the required impedance state (to store the required weights for the artificial neural network). The control circuity may comprise means (e.g. transistors 54, 56) to select a column signal line and means (e.g. shorting transistors 52a-52d) to couple column signal lines together.

Writing the non-volatile memory elements coupled to odd (discontinuous) columns 21' is achieved by first writing the non-volatile memory elements of the even columns 20' into the HRS (or HIS), which effectively means they are in an "open circuit" state. Secondly, an odd column 21' is shorted to a neighbouring even column 20' (via shorting transistors 52a to 52d), and the non-volatile memory elements of the odd columns 21' are written through the even columns 20'. The shorting transistors 52a to 52d may achieve this with minimum voltage degradation. Once the non-volatile memory elements coupled to the odd columns 21' have been written/programmed into the required impedance state, the odd columns 21' are disconnected from the even columns 20'. The non-volatile memory elements coupled to the even columns 20' are written again, this time into the required impedance state. (A particular non-volatile memory element is selected by selecting the appropriate row and column signal lines).

Writing is typically achieved by pulling all the column signal lines 20', 21' low, and biasing the row signal lines 18' with either the "set" or the "reset" voltage. Accidental writes to the sneak leakage paths is prevented due to the compliance current requirement which is limited by having multiple CES elements in series.

The shorting transistors 52a to 52d may be routed using a third metal layer in the crosspoint array module, such that they may exist within a crosspoint array "shadow" and not consume additional area. Hence, the bulk of the area may be dominated by the crosspoint array. This arrangement achieves an extremely area-efficient implementation of a CES-based crosspoint array.

In embodiments, each non-volatile memory element may be coupled to a switching transistor 58. In embodiments, instead of driving a non-volatile memory element into HRS (or HIS), the switching transistor 58 may be used to disconnect a non-volatile memory element from the crosspoint array module, i.e. to deactivate a particular path through the crosspoint array module. However, this requires additional circuitry.

Thus, in embodiments, each of the N row signal lines of each crosspoint array module is formed of a continuous conductive channel which runs across the crosspoint array module; and each of the M column signal lines of each crosspoint array module comprises: a plurality of continuous column signal lines, wherein each continuous column signal line is formed of a continuous conductive channel which runs across the crosspoint array module; and a plurality of discontinuous column signal lines, wherein each discontinuous column signal line is formed of multiple spatially separated conductive channels. The multiple conductive channels that form each discontinuous column signal line (e.g. column signal lines 21' in FIG. 6) may be formed in a single metal layer.

The plurality of continuous column signal lines may be interlaced with the plurality of discontinuous column signal lines in an alternating arrangement.

Control circuitry may be configured to drive each non-volatile memory element of each crosspoint array module that is in electrical communication with a continuous column signal line by: selecting a continuous column signal line; and driving each non-volatile memory element connected to the selected continuous line dependent on the generated programming signal.

Control circuitry may be configured to drive each non-volatile memory element that is in electrical communication with a discontinuous column signal line by: writing each non-volatile memory connected to a neighbouring continuous column signal line into a first impedance state; connecting the discontinuous column signal line to the neighbouring continuous column signal line; driving each non-volatile memory element connected to the discontinuous line dependent on the generated programming signal; and disconnecting the discontinuous column signal line from the neighbouring continuous column signal line.

Figure 7:
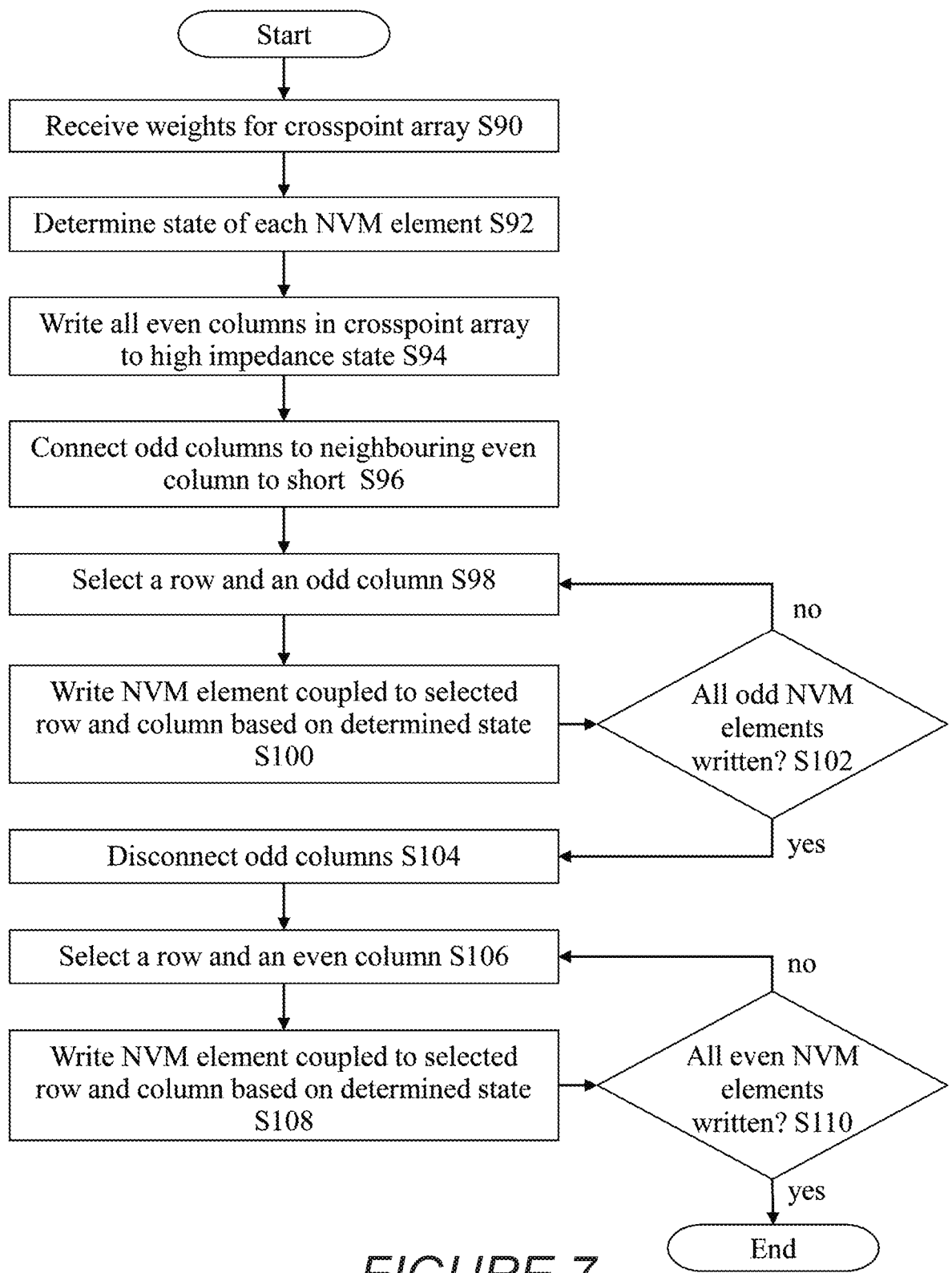
FIG. 7 shows a circuit diagram of an example 3×3 crosspoint array, where each neural network node comprises a crosspoint array module formed of parallel non-volatile memory elements.

FIG. 7 is a flow diagram illustrating example steps to implement or program the weights into a neural network formed of non-volatile memory elements arranged in series. The process begins by receiving weights for the crosspoint array 104 from a remote server 110 (step S90). Control circuitry 112 may determine, using the received weights, which impedance state (LIS or HIS) each non-volatile memory (NVM) element in the crosspoint array 104 is required to be in to implement the received weights at each neural network node (step S92). This may be performed individually for each neural network node, i.e. for the crosspoint array module at a neural network node. At step S94, all the even columns in a crosspoint array module (of a neural network node) are written to a high impedance state. Each odd column in a crosspoint array module is connected to a neighbouring even column to short the odd columns (step S96). A row and an odd column are selected (step S98) and the non-volatile memory element coupled to the selected row and column is written/programmed into the required impedance state (step S100). The control circuitry 112 may check if all of the non-volatile memory elements coupled to odd columns have been written (step S102) and if not, the selection and writing process is repeated until all of these NVM elements have been written. The odd columns are then disconnected from the neighbouring even columns (step S104). The NVM elements coupled to the even columns may now be written, one at a time, by selecting a row and an even column (step S106). The selected NVM element is written into the required impedance state (step S108). The control circuitry 112 may check if all of the non-volatile memory elements coupled to even columns have been written (step S110) and if not, the selection and writing process is repeated until all of these NVM elements have been written. The process then ends. Note that while the even columns are being written to, the NVM elements in the odd columns are not perturbed since they are effectively disconnected from the write circuitry.

The above-described techniques can be used to provide larger crosspoint arrays to increase the resistance scale. For example, each neural network node 12 may comprise an 8×8 crosspoint array module, which may increase the resistance scale to an 8-level scale (i.e. Req=R, 3R, 5R, 7R, 9R, 11R, 13R, 15R}), thereby achieving fully populated 3-bit encoding. Similarly, a 32×32 crosspoint array module may achieve a 16-level scale and a fully populated 4-bit encoding.

Each resistance value in a resistance scale is equally separated from its neighbouring resistance values by 2R. This may enable any effects arising from CES element process variations to be mitigated. A crosspoint array may be constructed of any size and for the required encoding simply by using crosspoint array modules at each neural network node of the appropriate size. For example, to implement a 256×256 artificial neural network, a 256×256 crosspoint array is required. If a 3-bit resistance encoding is required, each neural network node comprises an 8×8 crosspoint array module. If a neural network comprises 256 inputs and 256 outputs, the resultant neural network will have a total of $2^{16}$ (256×256) neural network nodes. Each neural network node (as mentioned before) requires an 8×8 crosspoint array module in order to provide 3-bit resistance encoding. Hence, a neural network implemented using a 256×256 crosspoint array, and which provides 3-bit encoding, effectively comprises an array of 1024×1024 NVM elements (i.e. 1 MB of memory).

All-Digital Multi-Bit Resistance Matrix

Figure 8:
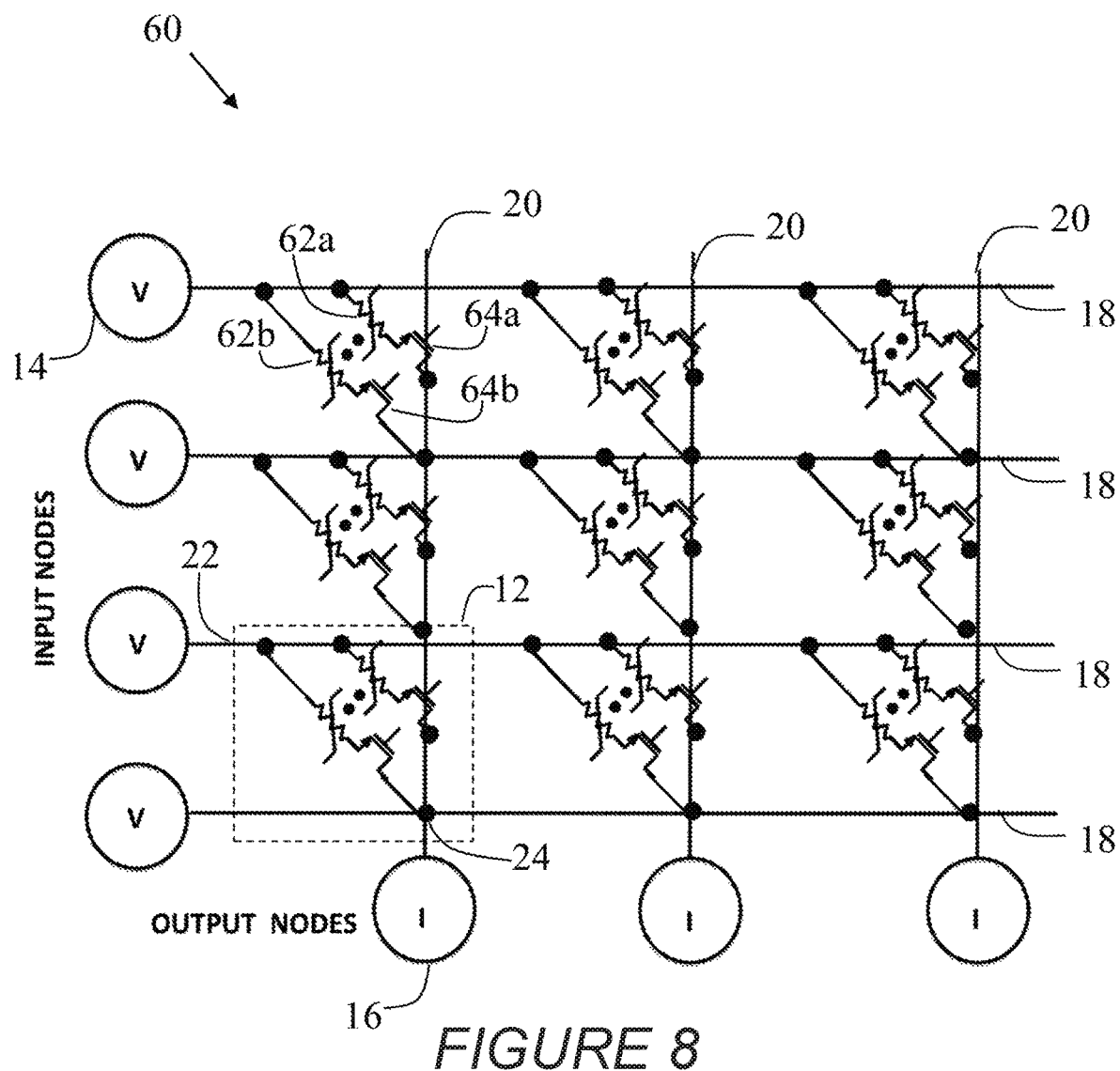
FIG. 8 is a circuit diagram illustrating how negative weights are applied in the neural network.

As mentioned above with reference to FIG. 3, each neural network node 12 of the crosspoint array 10 may comprise a crosspoint array module which comprises two or more non-volatile memory elements arranged in a parallel connection between the neural network node input 22 to the neural network node output 24. FIG. 8 shows a circuit diagram of an example 3×3 crosspoint array 60, where each neural network node 12 comprises a crosspoint array module formed of parallel non-volatile memory elements. The parallel connection of non-volatile memory elements in each neural network node 12 is used to create a range of conductance (G) values that can be encoded digitally.

Thus, in embodiments each neural network node comprises a crosspoint array module, and the plurality of programmable non-volatile memory elements provided at each neural network node are arranged in the crosspoint array module. Each crosspoint array module comprises two or more non-volatile memory elements arranged in a parallel connection between a neural network node input to a neural network node output.

The crosspoint array modules may digitally encode a linear scale of conductance values in the crosspoint array. The crosspoint array may be configured to convert current to voltage. In this case, each input terminal of the crosspoint array may be configured to receive a current and each output terminal of the crosspoint array may be configured to output a voltage.

The crosspoint array 60 is formed of three column signal lines 20 and three row signal lines 18. At each neural network node 12 there are at least two non-volatile memory elements that are connected in parallel between the neural network node input 22 and neural network node output 24. In the illustrated example, there are two non-volatile memory elements 62a and 62b in each crosspoint array module at each neural network node 12. Each non-volatile memory element 62a, 62b is coupled to a switching transistor 64a, 64b. The switching transistors enable a particular non-volatile memory element to be connected or disconnected from the crosspoint array module of a neural network node 12.

To store weights for a particular ANN, each non-volatile memory element is addressed by programming both the row and the column voltages. Since all the non-volatile memory elements are in parallel, each row of the crosspoint array is coupled to an access device that enables selection of a single NVM element from the plurality of NVM elements in a row, and thereby prevents accidental writes. The access devices are usually only used for NVM element selection during programming. In embodiments, the access device may be shared across multiple neural network nodes 12 in the same row 18.

Thus, in embodiments, at least one access device may be coupled to the or each row signal line of the crosspoint array, wherein the access device is configured to select one of the plurality of non-volatile memory elements coupled to the row signal line.

Control or write circuitry may be configured to drive a non-volatile memory by: selecting, using the access device, one of the plurality of non-volatile memory elements; driving the selected non-volatile memory element dependent on the generated programming signal.

In embodiments, each non-volatile memory element may be coupled to a switching device, and the write circuitry is configured to: select, using the access device, one of the plurality of non-volatile memory elements; and control the switching device coupled to the selected non-volatile memory element to activate a path through the selected non-volatile memory element.

The parallel arrangement of NVM elements in this 3×3 crosspoint array provides equivalent resistances that are {R, R/2, R/3 . . . , R/8} apart. This is a non-linear resistance scale. However, the equivalent conductance scale increases linearly as follows {G, 2G, 3G . . . , 8G}. Thus, in this embodiment, it is the conductivity that is digitally encoded in a 3-bit scale.

In the illustrated embodiment, the ANN is configured to convert voltages to currents, such that the input nodes 14 received voltage values and the output nodes 16 output current values.

Figure 9:
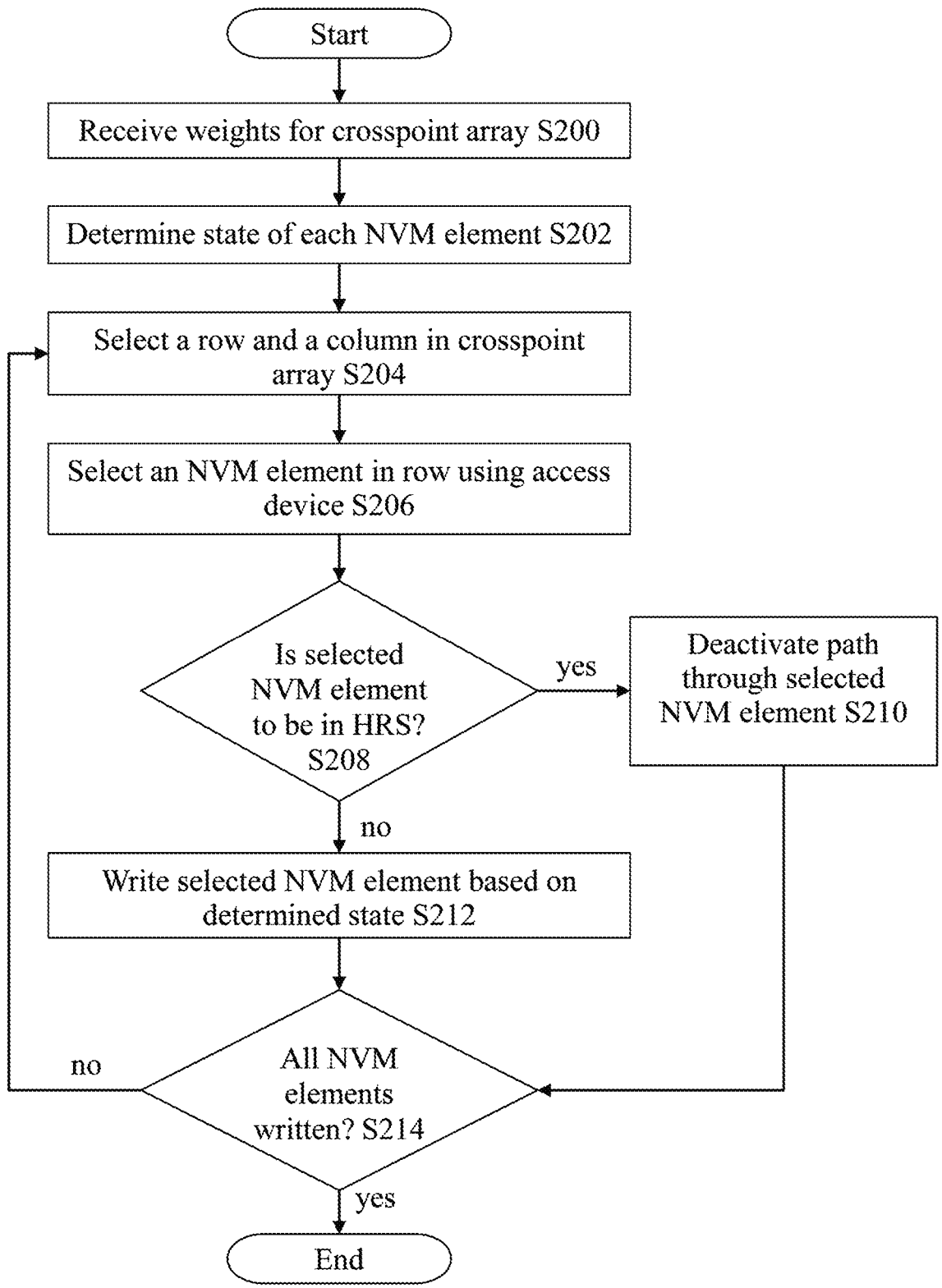
FIG. 9 is a flow diagram illustrating example steps to implement (or apply/program) weights in a neural network formed of non-volatile memory elements arranged in series.

FIG. 9 is a flow diagram illustrating example steps to implement or program weights into a neural network formed of non-volatile memory elements arranged in parallel. The process begins by receiving weights for the crosspoint array 104 from a remote server 110 (step S200). Control circuitry 112 may determine, using the received weights, which impedance state (LIS or HIS) each non-volatile memory (NVM) element in the crosspoint array 104 is required to be in to implement the received weights at each neural network node (step S202). This may be performed individually for each neural network node, i.e. for the crosspoint array module at a neural network node. At step S204, a row and a column of the crosspoint array 104 are selected. An access device is used to select one of the NVM elements of the plurality of parallel NVM elements in the selected row (step S206). In embodiments, if an NVM element is required to be programmed into an HRS state, it could either be programmed into HRS or it could be deselected/deactivated entirely. Thus, at step S208, the control circuitry may determine if the selected NVM element is to be written into HRS, and if so, may deactivate the path through the selected NVM element (step S210). Alternatively, the control circuity may write the NVM element into the required state (LRS or HRS) (step S212). The control circuitry 112 may check if all of the non-volatile memory elements in the crosspoint array have been written (step S214) and if not, the selection and writing process is repeated until all of the NVM elements have been written or deactivated. The process then ends.

Figure 10:
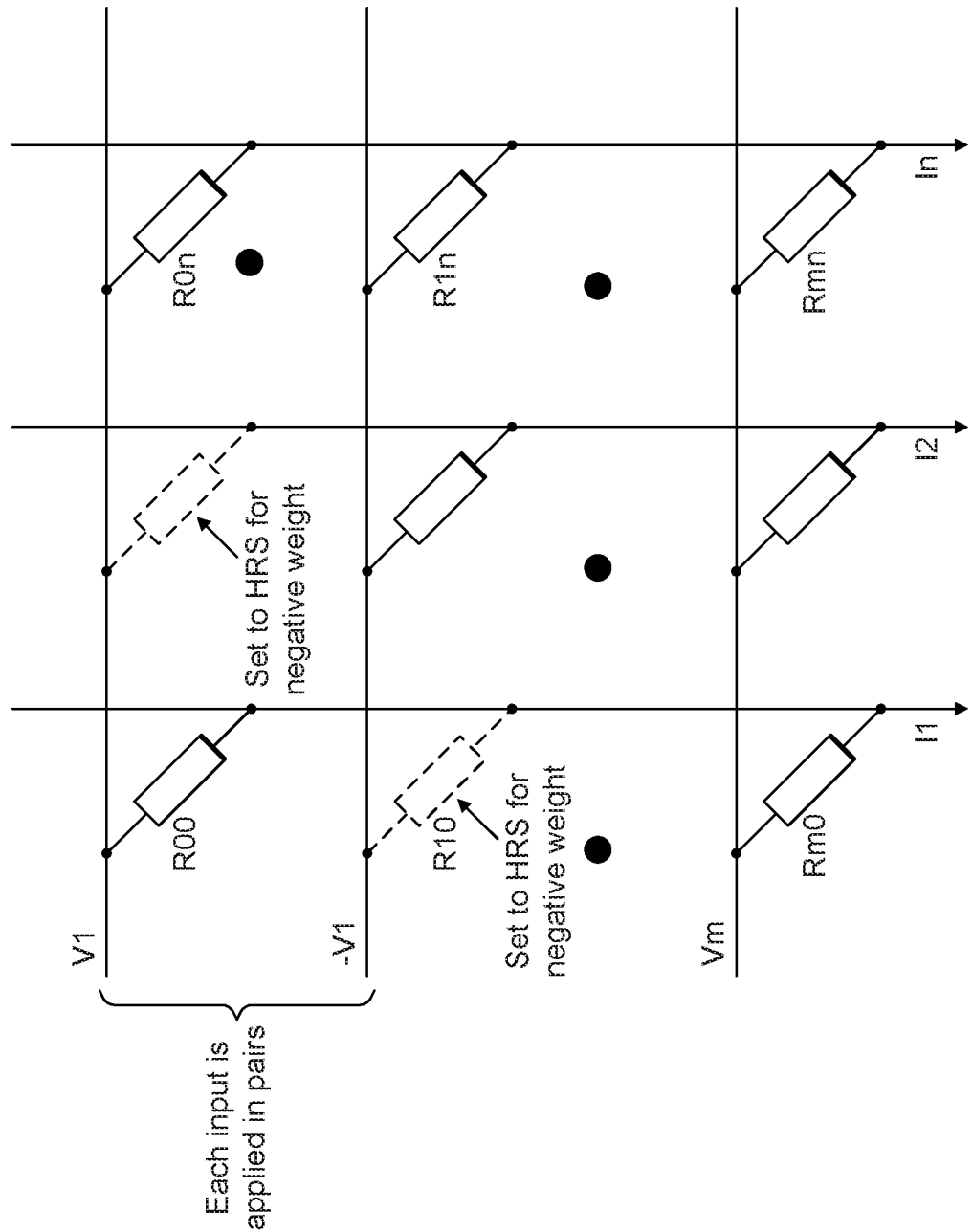
FIG. 10 is a flow diagram illustrating example steps to implement (or apply/program) weights in a neural network formed of non-volatile memory elements arranged in parallel.

FIG. 10 is a circuit diagram illustrating how negative weights are programmed into the artificial neural network implemented using parallel or series connected NVM elements in a crosspoint array. Here, for each negative weight implemented/programmed at a neural network node, a negative voltage is required. This may be done by using a negative reference voltage within a digital to analogue converter (DAC). For a negative weight at a neural network node, the column signal line at which the neural network node is provided is programmed such that a positive signal is programmed with infinity weight or HRS. A negative input is provided with the required weight. Thus, the negative input serves as a way of subtracting current away from the column.

Thus, in embodiments, the write circuitry may be configured to drive a non-volatile memory by: selecting, using the access device, one of the plurality of non-volatile memory elements; and driving the selected non-volatile memory element dependent on the generated programming signal. In embodiments, each non-volatile memory element may be coupled to a switching device, and the write circuitry may be configured to: select, using the access device, one of the plurality of non-volatile memory elements; and control the switching device coupled to the selected non-volatile memory element to activate a path through the selected non-volatile memory element.

Thus, the present techniques use NVM elements that have two distinct resistance states to provide an artificial neural network. The above-described techniques may use memristors, ReRAMs and/or CES elements as the NVM elements. Using CES elements may be particularly useful to mitigate process variations that give rise to resistance values. Previous approaches are susceptible to individual variations in the resistance values, whereas in the present techniques there is at least a 200% difference between successive resistance (or conductance) values.

The present techniques provide an artificial neural network that can be used for different applications easily, simply by obtaining the weights for each application and implementing them in the crosspoint array. The NVM elements may be programmed on the fly and therefore, it may be possible to reprogram the same neural network for different applications. For example, the ANN described herein may be used for low-power single keyword speed trigger; simple face detection for security cameras; or a voice activated UI as an alternative to physical or virtual buttons.

The present techniques provide weight storage (which may be a significant static power leakage source in neural networks) and provide neural network processing by means of converting voltage to current. There is no active switching taking place during the processing, which results in an energy-efficient ANN.

In embodiments, the ANN of the present techniques may be used to further tune the ANN weightings. For example, the crosspoint array may be coupled to a hardware feedback module, which could potentially be used to optimise the weights of each neural network node. This may be achieved by measuring currents in the crosspoint array (e.g. at each neural network node output) and feeding the measured current back into the ANN to tune the weights stored in each neural network node.

In embodiments, the ANN of the present techniques may comprise a plurality of crosspoint arrays, where each crosspoint array provides one layer of the ANN. For example, a first crosspoint array may implement a conductance matrix which converts voltages to currents, and a second crosspoint array may implement a resistance matrix which converts currents to voltages. The outputs pf the first crosspoint array may provide the inputs of the second crosspoint array, such that the ANN converts voltage to current to voltage across the two layers.

Figure 11A:
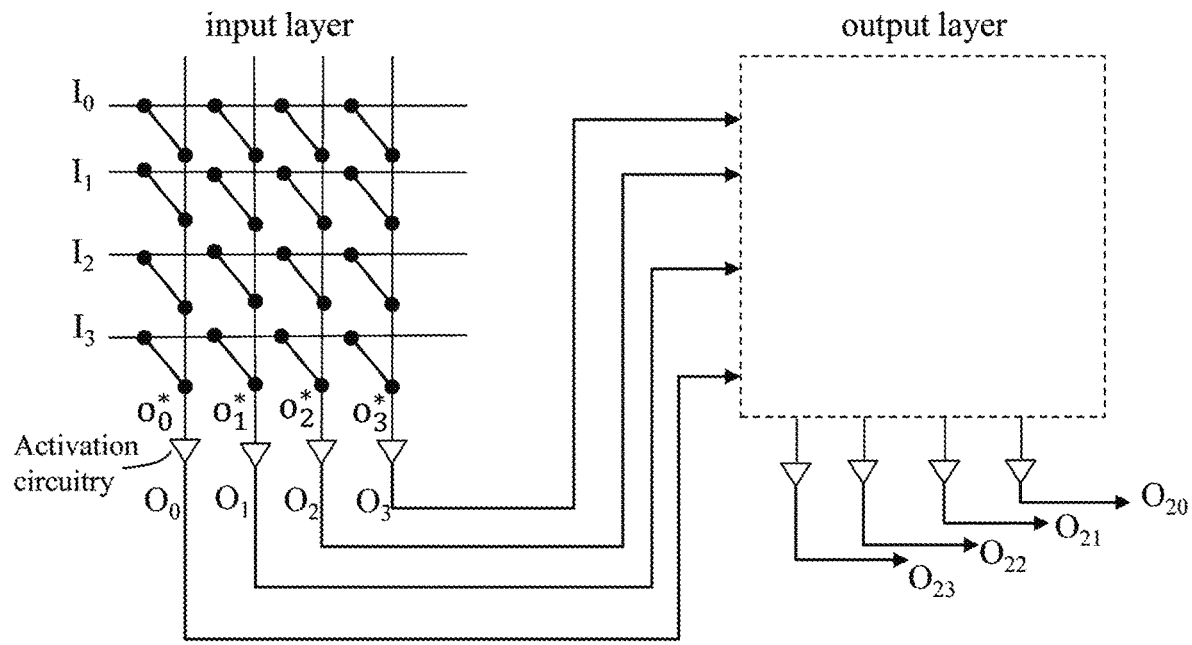
FIG. 11a shows a circuit diagram of a tiered artificial neural network implemented using crosspoint arrays.
Figure 11B:
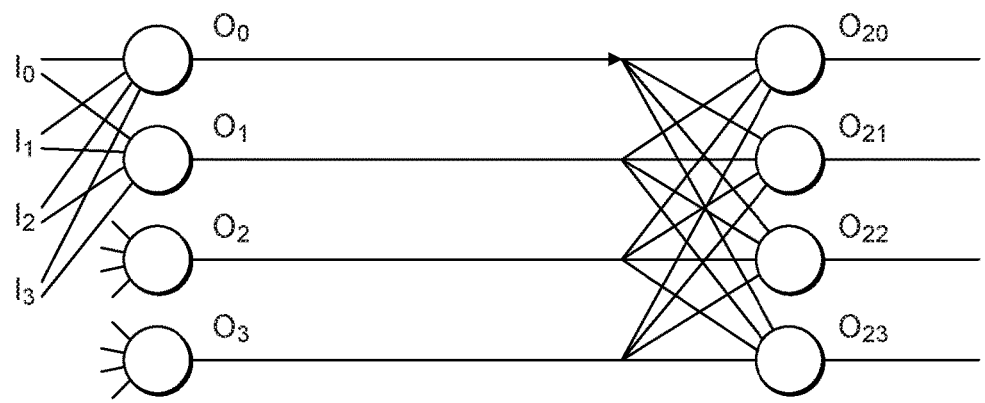

In embodiments, the apparatus may comprise a plurality of crosspoint arrays, wherein each crosspoint array provides one layer in a multi-layer (or tiered) artificial neural network. FIG. 11a shows a circuit diagram of a tiered artificial neural network implemented using crosspoint arrays, and FIG. 11b shows a schematic version of FIG. 11a.

Broadly speaking, the techniques described herein implement a dot-product computation of weights and input values in an artificial neural network (ANN). As mentioned above, an artificial neural network (ANN), or each ANN layer within a tiered ANN, has at least one in-edge (i.e. input into the ANN) and at least one out-edge (i.e. output of the ANN). Between the in-edge(s) and out-edge(s) of the ANN are multiple neural network nodes. Each neural network node has its own in-edges and out-edges. The term "dot-product" used herein refers to the multiplication of the weight associated with each in-edge of an ANN with the magnitude of the input voltage that connects the particular edge to a neural network node. In general, each neural network node may have multiple such edges driven by multiple such inputs. The computation at each neural network node may occur in two distinct steps. The first step comprises summing the products of the weights and the input magnitudes (dot-product or the multiply-accumulate), as shown in FIG. 1b. The second step comprises using this sum as an input to an activation function of the neural network node. The activation function is the non-linear part of the computation, and may be considered a "squashing function". The activation function of a neural network node defines the output of the node given particular inputs. In some cases, the activation function may be binary, such that the node can either fire or not fire. The activation or squashing function can take several forms, such as a Rectified Linear Unit (ReLU), a hyperbolic tangent (sigmoid) function, a Heaviside step function, a piece-wise linear function, etc. In the simplest case, the squashing function could be a binary function: if the sum of the products of the weights and the inputs is less than zero, then the neural network node outputs a "0" (or low voltage), else it outputs a "1" (or high voltage).

The present techniques provide a low-power and energy-efficient implementation of the dot-product (multiply-and-accumulate) computation within an ANN. FIGS. 11a and 11b show generalised schematic diagrams of an ANN comprising two layers: an input layer (comprising inputs $I_0 \ldots I_3$) and an output layer (comprising outputs $O_{20} \ldots O_{23}$). In general, there may be multiple hidden layers of neural network nodes. Without loss of generality, FIGS. 11a and 11b show a two-layer ANN to illustrate how the crosspoint arrays of the present techniques may be used to provide multi-layer ANNs. The crosspoint array takes the input values (e.g. inputs $I_0 \ldots I_3$), and performs a dot-product computation using the weights stored by the non-volatile memory elements provided at each neural network node of the array.

The inputs into the ANN (e.g. inputs $I_0 \ldots I_3$) may be provided as voltage values or as current values. For voltage inputs, the crosspoint array transforms the inputs to the intermediate outputs (O*), using the weights stored by the NVM elements provided at each node. For current inputs, the intermediate outputs (O*) are voltage values. These outputs (O*) are provided as inputs into circuitry that implements the activation function (i.e. the squashing function, or non-linear part of the computation), represented by the triangles in FIG. 11a. In the simplest case, this squashing or activation function may be a binary function, e.g. a step function, as explained above. The final outputs for the first layer in the ANN is denoted as $O_{<1,2,3,4>}$ in FIG. 11a, and these outputs form the inputs to the second layer in the ANN, as shown.

In embodiments, a crosspoint array may form each layer of an artificial neural network. Alternatively, a crosspoint array may form one or more (but not necessarily all) layers of an artificial neural network. In each case, the outputs of one crosspoint array are fed into circuitry that implements the activation function computation, prior to being supplied as the inputs into the subsequent layer of the artificial neural network.

Thus, in embodiments, the crosspoint array of the apparatus is a first crosspoint array forming a first layer in the artificial neural network, wherein the first crosspoint array comprises a plurality of inputs $I_{1p}$ and a plurality of outputs $O_{1q}$. The apparatus may comprise a second crosspoint array forming a second layer in the artificial neural network, wherein the second crosspoint array comprises a plurality of inputs $I_{2r}$ and at least one output $O_{2s}$. In this embodiment, the apparatus may comprise further circuitry between each layer of the ANN to implement the activation function for each output edge of each layer.

The outputs $O_{1q}$ of the first crosspoint array may be coupled to the inputs $I_{2r}$ of the second crosspoint array. In embodiments, the first crosspoint array digitally encodes a linear scale of conductance values, and the second crosspoint array digitally encodes a linear scale of impedance values. In embodiments, the first crosspoint array converts voltage to current, and the second crosspoint array converts current to voltage.

As mentioned earlier, the apparatus may be a constrained resource device such as an internet of things (IoT) device.

The present techniques provide a method of implementing a reconfigurable artificial neural network in a crosspoint array comprising at least one neural network node located at an intersection of a row signal line and a column signal line, the method comprising: receiving data specifying a weight for each neural network node of the crosspoint array; switching a plurality of non-volatile memory elements provided at each neural network node into a required impedance state to implement the specified weight at each neural network node; and storing, using the non-volatile memory elements, the weight for each neural network node of the crosspoint array.

The present techniques provide a system of implementing a reconfigurable artificial neural network, the system comprising: an apparatus as described herein; a remote server configured to train an artificial neural network model; wherein the apparatus is configured to receive data specifying a weight for each neural network node of the apparatus from the remote server.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

The invention claimed is:

1. An apparatus for implementing a reconfigurable artificial neural network, the apparatus comprising:
    a crosspoint array comprising:
        at least one row signal line and at least one column signal line;
        one or more neural network nodes, wherein at least one of the one or more neural network nodes is provided at an intersection of a row signal line and a column signal line, and wherein the at least one of the one or more neural network nodes to have an associated weight; and
        one or more programmable non-volatile memory elements provided at associated ones of the one or more neural network nodes to store the associated weight, wherein at least one of the one or more programmable non-volatile memory element to be switchable between a first impedance state and a second impedance state;
    a communication module configured to receive one or more data packets to specify weights for the one or more neural network nodes of the crosspoint array; and
    control circuitry configured to switch the at least one of the one or more programmable non-volatile memory elements provided at the at least one of the one or more neural network nodes into the first impedance state or the second impedance state to implement the weight at the neural network node,
    wherein the at least one of the one or more neural network nodes comprises at least one of one or more crosspoint array modules, and the at least one of the one or more programmable non-volatile memory elements to be provided in the at least one of the one or more neural network nodes is arranged in the one or more crosspoint array modules, and
    wherein the one or more crosspoint array modules comprise an array formed of N row signal lines and M column signal lines, wherein the at least one of the one or more programmable non-volatile memory elements is provided at an associated intersection of the N row signal lines and the M column signal lines.

2. The apparatus as claimed in claim 1, wherein the communication module configured to receive the one or more data packets specifying the weights for the one or more neural network nodes is configured to:
    extract, from at least one of the one or more data packets, the associated weight; and
    wherein the control circuitry is configured to:
        determine, using the associated weight, whether the at least one of the one or more programmable non-volatile memory elements is to be switched into the first impedance state or the second impedance state; and
        generate, responsive to the determination, a programming signal for the at least one of the one or more programmable non-volatile memory elements.

3. The apparatus as claimed in claim 2, wherein the control circuitry comprises write circuitry configured to:
    receive the generated programming signal for the at least one of the one or more programmable non-volatile memory elements; and
    drive the at least one of the one or more programmable non-volatile memory elements dependent on the generated programming signal.

4. The apparatus as claimed in claim 1, wherein the crosspoint array further comprises:
    at least one input terminal to receive an input signal for the crosspoint array; and
    at least one output terminal to provide an output signal generated by passing the input signal through the at least one of the one or more neural network nodes.

5. The apparatus as claimed in claim 4, wherein the at least one of the one or more neural network nodes to receive the input signal, multiply the associated weight with the input signal, and output a weighted signal.

6. The apparatus as claimed in claim 1, wherein the crosspoint array further comprises:
    one or more input terminals, at least one of the one or more input terminals to receive an input signal for the crosspoint array; and
    at least one output terminal to provide an output signal generated by passing the input signal through the at least one of the one or more neural network nodes.

7. The apparatus as claimed in claim 6 wherein the crosspoint array comprises a plurality of output terminals, each output terminal providing an associated output signal.

8. The apparatus as claimed in claim 6, wherein the at least one of the one or more neural network nodes receives two or more input signals, multiplies the associated weight with input signals received at the one or more input terminals to generate weighted signals, and outputs a summed signal representing summed weighted signals.

9. The apparatus as claimed in claim 8 wherein the at least one output terminal is configured to receive summed signals from the at least one of the one or more neural network nodes, and to combine the summed signals to provide the output signal.

10. The apparatus as claimed in claim 1, wherein the crosspoint array comprises:
   a direct path from a neural network node input terminal to a neural network node output terminal; and
   at least one indirect path from the neural network node input terminal to the neural network node output terminal.

11. The apparatus as claimed in claim 10, wherein the one or more crosspoint array modules to digitally encode a linear scale of impedance values.

12. The apparatus as claimed in claim 10, wherein the at least one indirect path between the neural network node input terminal to the neural network node output terminal is formed of two or more non-volatile memory elements in a series connection.

13. The apparatus as claimed in claim 10 wherein the crosspoint array is configured to convert voltage to current, and the neural network node input terminal is configured to receive a voltage and the neural network node output terminal is configured to output a current.

14. The apparatus as claimed in claim 10 wherein the crosspoint array is configured to convert current to voltage, and the neural network node input terminal of the crosspoint array is configured to receive a current and the neural network node output terminal of the crosspoint array is configured to output a voltage.

15. The apparatus as claimed in claim 10 wherein:
   at least one of the N row signal lines is formed of a first continuous conductive channel which runs across the at least one of the one or more crosspoint array modules; and
   at least one of the M column signal lines of the one or more crosspoint array modules comprises:
      one or more continuous column signal lines, wherein at least one of the one or more continuous column signal lines is formed of a second continuous conductive channel which runs across the at least one of the one or more crosspoint array modules; and
      a plurality of discontinuous column signal lines, wherein the plurality of discontinuous column signal lines are formed of multiple spatially separated conductive channels.

16. A method of implementing a reconfigurable artificial neural network in a crosspoint array comprising one or more neural network nodes, at least one of the one or more neural network nodes being located at an intersection of a row signal line and a column signal line and comprising a crosspoint array module, the crosspoint array module comprising one or more programmable non-volatile memory elements provided at the one or more neural network nodes being arranged in the crosspoint array module, the crosspoint array module comprising an array formed of N row signal lines and M column signal lines, at least one of the one or more programmable non-volatile memory elements being provided at one or more intersections of the N row signal lines and the M column signal lines, the method comprising:

receiving one or more data packets specifying a weight for the at least one of the one or more neural network nodes;

switching the at least one of the one or more programmable non-volatile memory elements provided at the at least one of the one or more neural network nodes into an impedance state to implement the specified weight for the at least one of the one or more neural network nodes; and storing, using the one or more programmable non-volatile memory elements, the weight for the at least one of the one or more neural network nodes.

17. A system of implementing a reconfigurable artificial neural network, the system comprising:
   a crosspoint array comprising:
      at least one row signal line and at least one column signal line;
      one or more neural network nodes, wherein at least one of the one or more neural network nodes is provided at an intersection of a row signal line and a column signal line, and wherein the least one of the one or more neural network nodes to have an associated weight; and
      one or more programmable non-volatile memory elements provided at associated ones of the one or more neural network nodes to store the associated weight, wherein at least one of the one or more programmable non-volatile memory element to be switchable between a first impedance state and a second impedance state;
   a communication module configured to receive one or more data packets to specify weights for the one or more neural network nodes of the crosspoint array; and
   control circuitry configured to switch the at least one of the one or more programmable non-volatile memory elements provided at the at least one of the one or more neural network nodes into the first impedance state or the second impedance state to implement the weight at the neural network node,
   wherein the at least one of the one or more neural network nodes comprises at least one of one or more crosspoint array modules, and the at least one of the one or more programmable non-volatile memory elements to be provided in the at least one of the one or more neural network nodes is arranged in the one or more crosspoint array modules, and
      wherein the one or more crosspoint array modules comprise an array formed of N row signal lines and M column signal lines, wherein the at least one of the one or more programmable non-volatile memory elements is provided at an associated intersection of the N row signal lines and the M column signal lines; and
   a remote server configured to train an artificial neural network model,
   wherein the system is configured to receive a data packet specifying the weight transmitted from the remote server.

* * * * *